(12) United States Patent
Yoo et al.

(10) Patent No.: US 9,893,053 B2
(45) Date of Patent: Feb. 13, 2018

(54) SEMICONDUCTOR DEVICE INCLUDING ESD PROTECTION CIRCUIT

(71) Applicant: Samsung Electronics Co., Ltd., Suwon-si (KR)

(72) Inventors: Jae-Hyun Yoo, Suwon-si (KR); Kee-Moon Chun, Seongnam-si (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 381 days.

(21) Appl. No.: 14/697,707

(22) Filed: Apr. 28, 2015

(65) Prior Publication Data
US 2016/0104701 A1    Apr. 14, 2016

(30) Foreign Application Priority Data
Oct. 14, 2014 (KR) .......................... 10-2014-0138380

(51) Int. Cl.
| | |
|---|---|
| *H02H 9/00* | (2006.01) |
| *H01L 27/02* | (2006.01) |
| *H01L 23/535* | (2006.01) |
| *H01L 29/08* | (2006.01) |
| *H01L 29/161* | (2006.01) |
| *H01L 29/16* | (2006.01) |
| *H01L 29/06* | (2006.01) |

(52) U.S. Cl.
CPC ........ *H01L 27/0274* (2013.01); *H01L 23/535* (2013.01); *H01L 29/0649* (2013.01); *H01L 29/0847* (2013.01); *H01L 29/161* (2013.01); *H01L 29/1608* (2013.01); *H01L 2924/0002* (2013.01)

(58) Field of Classification Search
CPC .................................................. H01L 27/0274
USPC ............................................................. 361/56
See application file for complete search history.

(56) References Cited

U.S. PATENT DOCUMENTS

| | | | |
|---|---|---|---|
| 6,809,386 B2 * | 10/2004 | Chaine | ................ H01L 27/0266 257/355 |
| 6,914,305 B2 | 7/2005 | Kwon et al. | |
| 7,518,192 B2 | 4/2009 | Yu et al. | |

(Continued)

FOREIGN PATENT DOCUMENTS

KR    10-2007-0074036    7/2007

*Primary Examiner* — Stephen W Jackson
(74) *Attorney, Agent, or Firm* — Muir Patent Law, PLLC

(57) ABSTRACT

A semiconductor device including an electrostatic discharge (ESD) protection circuit includes an input port, a logic circuit receiving an input signal applied to the input port and generating an output signal based on the input signal, and an ESD protection circuit adjusting a level of the input signal when the level of the input signal exceeds a predetermined range. The ESD protection circuit includes a first fin and a second fin arranged on a semiconductor substrate in parallel, and a gate electrode formed in a direction crossing the first fin and the second fin, each of the first fin and the second fin includes a source region, a drain region, and a channel region disposed between the source region and the drain region, the channel region is disposed under the gate electrode, a source region of the first fin and a drain region of the second fin are disposed at a first side of the gate electrode, and a drain region of the first fin and a source region of the second fin are disposed at a second side of the gate electrode.

20 Claims, 30 Drawing Sheets

(56) References Cited

U.S. PATENT DOCUMENTS

| | | |
|---|---|---|
| 7,625,790 B2 | 12/2009 | Yang |
| 8,102,001 B2 | 1/2012 | Ker et al. |
| 8,400,742 B2 * | 3/2013 | Lai .................. H02H 9/044 361/111 |
| 8,703,547 B2 * | 4/2014 | Shan .................. H01L 27/0262 257/173 |
| 8,723,265 B2 | 5/2014 | Chen et al. |
| 8,735,993 B2 | 5/2014 | Lo et al. |
| 9,548,295 B2 * | 1/2017 | Domanski .......... H01L 27/0259 |
| 2005/0029597 A1 | 2/2005 | Worley |
| 2008/0042207 A1 | 2/2008 | Wu et al. |
| 2011/0103125 A1 | 5/2011 | Tomishima |
| 2013/0234250 A1 | 9/2013 | Lin et al. |
| 2014/0193959 A1 | 7/2014 | Lo et al. |

* cited by examiner (a)

(b)

(a)

(b)

1200

1400

SEMICONDUCTOR DEVICE INCLUDING ESD PROTECTION CIRCUIT

CROSS-REFERENCE TO RELATED APPLICATION

This application claims priority to Korean Patent Application No. 10-2014-0138380 filed on Oct. 14, 2014 in the Korean Intellectual Property Office, the contents of which are herein incorporated by reference in their entirety.

BACKGROUND

1. Technical Field

The present disclosure relates to a semiconductor device including an electrostatic discharge (ESD) protection circuit.

2. Description of the Related Art

In recent years, semiconductor devices are advancing toward achievement of high-speed, low-voltage operations and semiconductor device manufacturing processes are developing to achieve higher integration levels.

The improved device integration levels may cause a short channel effect to a semiconductor device such as a field effect transistor. Accordingly, research into fin type field effect transistors (Fin FETs) in which a channel is formed in a 3D structure is actively being conducted.

SUMMARY

The present disclosure provides a semiconductor device enabling an electrostatic discharge (ESD) operation and having improved reliability.

According to an aspect of the present inventive concept, there is provided a semiconductor device including an input port, a logic circuit receiving an input signal applied to the input port and generating an output signal based on the input signal, and an ESD protection circuit adjusting a level of the input signal when the level of the input signal exceeds a predetermined range, wherein the ESD protection circuit includes a first fin and a second fin arranged on a semiconductor substrate in parallel, and a gate electrode formed in a direction crossing the first fin and the second fin, each of the first fin and the second fin includes a source region, a drain region, and a channel region disposed between the source region and the drain region, the channel region is disposed under the gate electrode, a source region of the first fin and a drain region of the second fin are disposed at a first side of the gate electrode, and a drain region of the first fin and a source region of the second fin are disposed at a second side of the gate electrode.

According to another aspect of the present inventive concept, there is provided a semiconductor device including a first fin and a second fin disposed on a semiconductor substrate to be parallel with each other, a gate electrode formed in a direction crossing the first and the second fin, a source region of the first fin and a drain region of the second fin disposed at a first side of the gate electrode, a drain region of the first fin and a source region of the second fin disposed at a second side of the gate electrode, first and second wires disposed at the first side of the gate electrode and formed to be parallel with the gate electrode, and third and fourth wires disposed at the second side of the gate electrode and formed to be parallel with the gate electrode, wherein the first wire is electrically connected to the drain region of the first fin, the second wire is electrically connected to the source region of the second fin, the third wire is electrically connected to the source region of the first fin and the second wire, and the fourth wire is electrically connected to the drain region of the second fin and the first wire.

According to still another aspect of the present inventive concept, there is provided a semiconductor device including an input port, a logic circuit receiving an input signal applied to the input port and generating an output signal based on the received input signal, and an ESD protection circuit adjusting a level of the input signal when the level of the input signal is out of a predetermined range, wherein the ESD protection circuit includes first and second transistors each including a source, a drain and a gate interposed between the source and the drain, a first parasitic transistor formed between the source of the first transistor and the drain of the second transistor, and a second parasitic transistor formed between the drain of the first transistor and the source of the second transistor.

BRIEF DESCRIPTION OF THE DRAWINGS

The above and other features and advantages of the present disclosure will become more apparent by describing in detail various embodiments thereof with reference to the attached drawings in which.

DETAILED DESCRIPTION OF THE EMBODIMENTS

Figure 1:
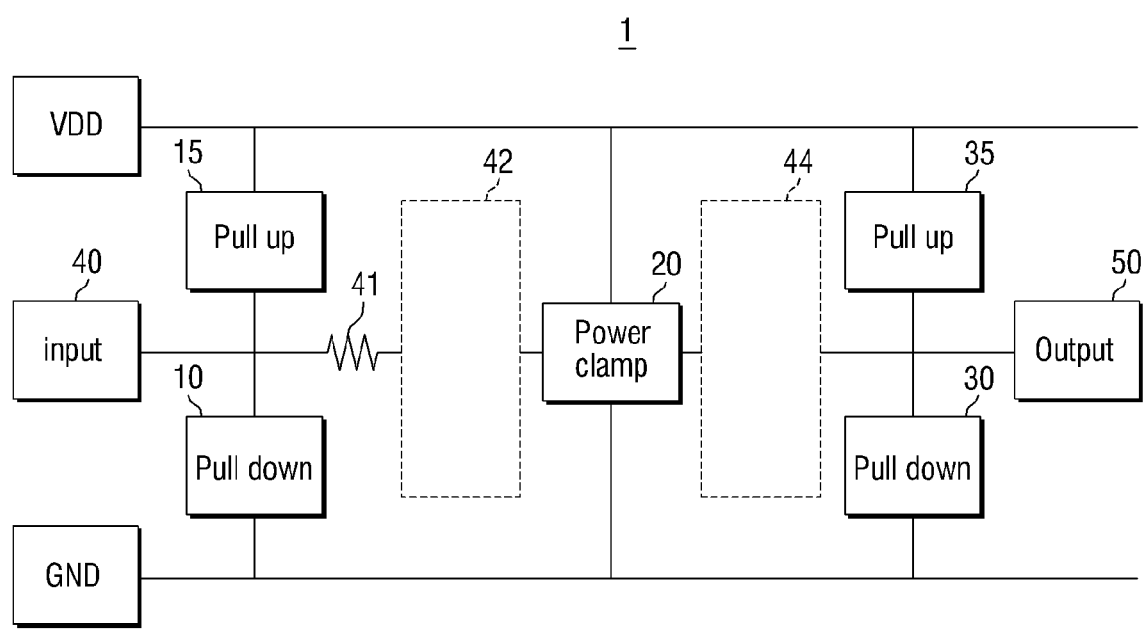
FIG. 1 is a block diagram of a semiconductor device including an ESD protection circuit according to an embodiment of the present inventive concept.

Advantages and features of aspects of the present inventive concept and methods of accomplishing the same may be understood more readily by reference to the following detailed description of various embodiments and the accompanying drawings. The present inventive concept may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to," or "coupled to" another element or layer, it can be directly on, connected, or coupled to the other element or layer or intervening elements or layers may be present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicats otherwise, these terms are only used to distinguish one element, component, region, layer or section from another region, layer or section, for example as a naming convention. Thus, a first element, component, region, layer or section discussed in one section of the specification could be termed a second element, component, region, layer or section in another section of the specification without departing from the teachings of the present disclosure. In addition, in certain cases, even if a term is not described using "first," "second," etc., in the specification, it may still be referred to as "first" or "second" in a claim in order to distinguish different claimed elements from each other.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Hereinafter, semiconductor devices according to some embodiments of the present inventive concept will be described with reference to FIGS. 1 to 30.

FIG. 1 is a block diagram of a semiconductor device including an ESD protection circuit according to an embodiment of the present inventive concept.

As used herein, a semiconductor device may refer to any of the various devices such as shown in FIGS. 1-22, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

In general, a semiconductor device is very sensitively affected by a high voltage externally applied from electrostatic discharge (ESD) (or static electricity). In a case where a high voltage is instantaneously applied into a chip due to the ESD, the applied high voltage may cause damage to a thin insulation layer or channels formed in an integrated circuit, resulting in demolishing of the chip. Therefore, to protect the circuit from external ESD, the semiconductor device has an ESD protection circuit and a power clamp circuit incorporated for each pad.

Referring to FIG. 1, the semiconductor device 1 according to an embodiment of the present inventive concept includes ESD protection circuits 10, 15, 20, 30 and 35, logic circuits 42 and 44, an input port 40, and an output port 50.

The input port 40 may transmit the input signal to the logic circuits 42 and 44 included in the semiconductor device and the output port 50 may transmit signals output from the logic circuits 42 and 44 to an external device. In detail, the signal applied through the input port 40 may be transmitted to the logic circuits 42 and 44 through a resistor 41. The resistor 41 may serve as a buffer, but aspects of the present inventive concept are not limited thereto. In one embodiment, the resistor 41 may not be provided. The input port 40 may be connected to an input pad. Likewise, the output port 50 may also be connected to an output pad.

The logic circuits 42 and 44 may receive the input signal applied to the input port 40 and may generate an output signal based on the received input signal. The logic circuits 42 and 44 may include various transistors TRs, resistor R, a capacitor C, and so on. The logic circuits 42 and 44 may generate particular outputs for particular inputs. For example, the logic circuits 42 and 44 may perform actual operations desired by a user. The logic circuits 42 and 44 may include a first logic circuit 42 and a second logic circuit 44. The first logic circuit 42 and the second logic circuit 44 may be integrally formed.

The ESD protection circuit may include, for example, pull-up circuits 15 and 35, pull-down circuits 10 and 30, and a power clamp circuit 20.

The ESD protection circuit may adjust a level of the input signal when the level of the input signal deviates from a predetermined range. For example, when a high-voltage input signal is instantaneously applied, the ESD protection circuit may reduce the voltage of the input signal. The predetermined range may be a range in which the logic circuits 42 and 44 included in the semiconductor device of the present inventive concept can normally operate.

The pull-down circuits 10 and 30 of the ESD protection circuit may include a gate-grounded NMOS transistor (GGNMOS), the pull-up circuits 15 and 35 of the ESD protection circuit may include a gate-grounded PMOS (GGPMOS), and the power clamp circuit 20 may include a gate-coupled NMOS (GCNMOS), but aspects of the present inventive concept are not limited thereto.

The pull-up circuits 15 and 35 may be disposed between the input port 40 and a power supply VDD or between the output port 50 and the power supply VDD. The pull-down circuits 10 and 30 may be disposed between the input port 40 and a ground GND or between the output port 50 and the ground GND. The power clamp circuit 20 may be disposed between the power supply VDD and the ground GND and may be connected to the logic circuits 42 and 44.

In one embodiment, the pull-up circuits 15 and 35 may receive a negative (−) ESD not greater than a ground voltage from the input port 40 to discharge the received negative (−) ESD to the power supply VDD or to discharge the received negative (−) ESD to the ground GND through the power clamp circuit 20. In addition, the pull-down circuits 10 and 30 may receive a positive (+) ESD not greater than a power voltage to discharge the received positive (+) ESD to the ground GND or to discharge the received positive (+) ESD to the power supply VDD through the power clamp circuit 20, but aspects of the present inventive concept are not limited thereto.

Accordingly, the semiconductor device according to certain embodiments may protect the logic circuits 42 and 44 from ESD applied from the input port 40 through the ESD protection circuits 10, 15, 20, 30 and 35. Arrangement of the power clamp circuit 20, the pull-up circuits 15 and 35, and the pull-down circuits 10 and 30 disposed between logic circuits is not limited to that illustrated in FIG. 1.

Figure 2:
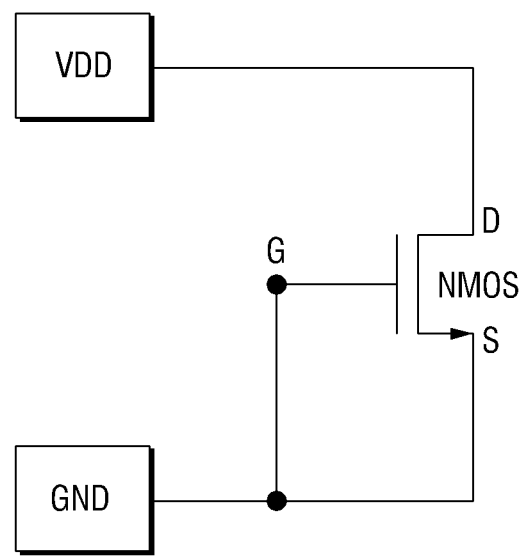
FIG. 2 is a circuit view illustrating a transistor included in a semiconductor device including an ESD protection circuit according to an embodiment of the present inventive concept.
Figure 3:
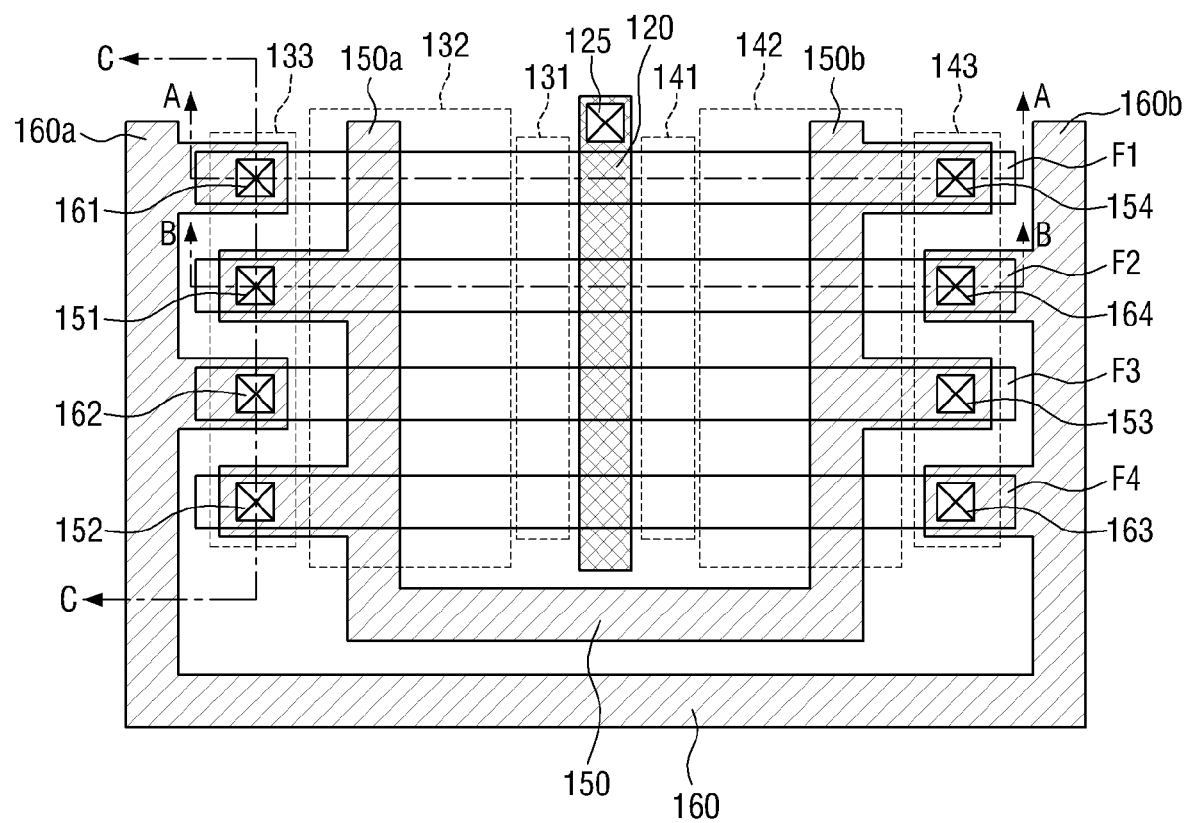
FIG. 3 is a layout view illustrating an ESD protection circuit according to an embodiment of the present inventive concept.
Figure 4:
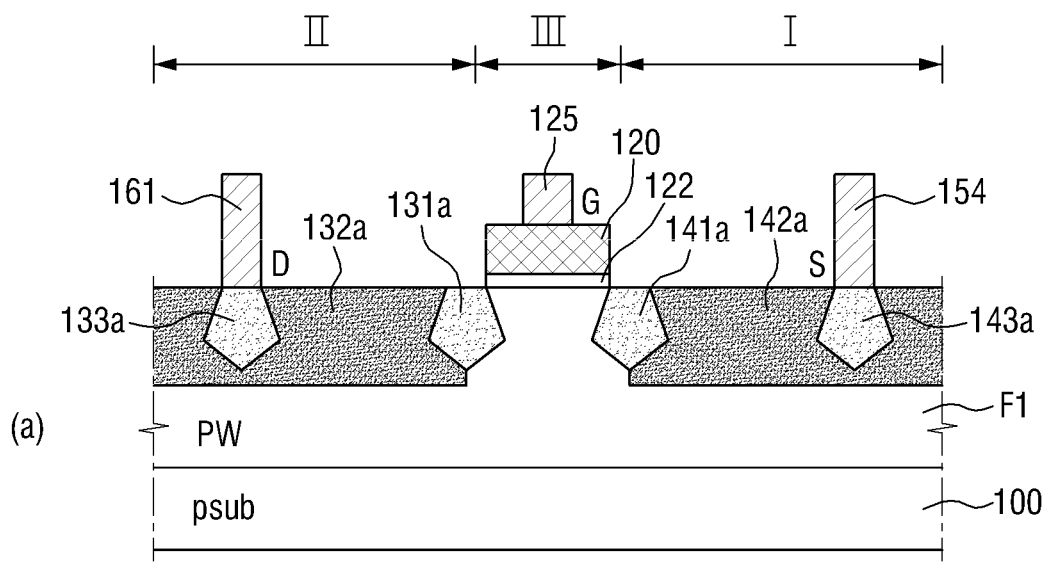
FIG. 4 is a cross-sectional view taken along the lines A-A and B-B of FIG. 3 according to an embodiment of the present inventive concept.
Figure 4:
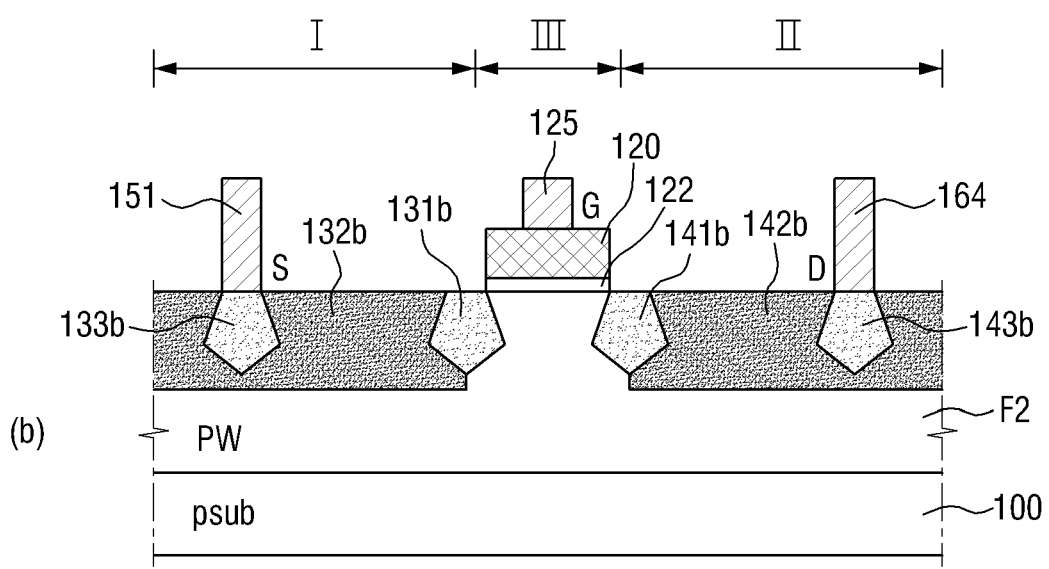
Figure 5:
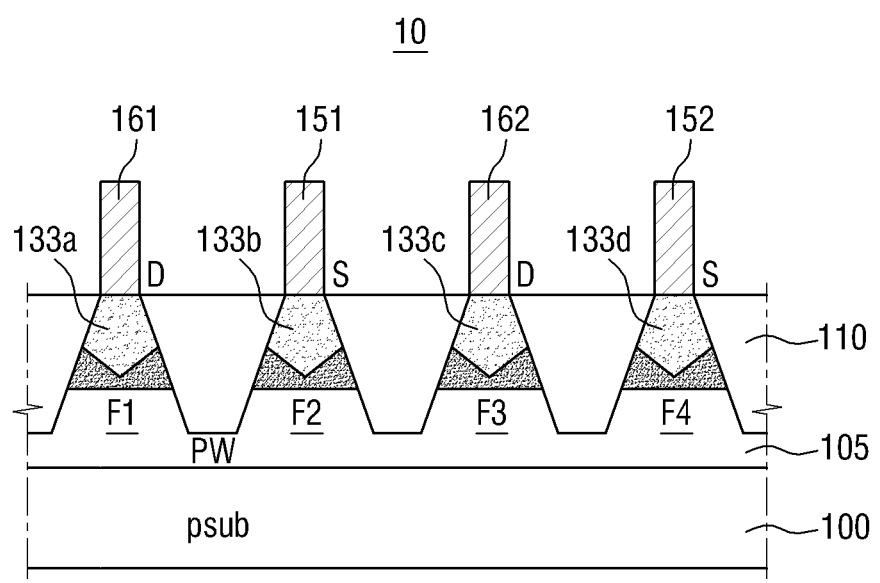
FIG. 5 is a cross-sectional view taken along the line C-C of FIG. 3 according to an embodiment of the present inventive concept.
Figure 6:
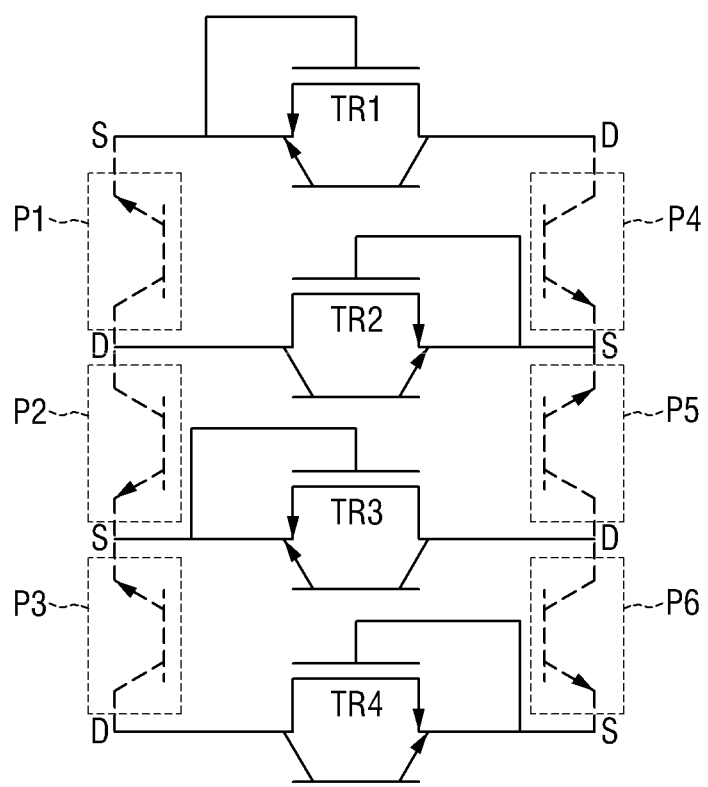
FIG. 6 is a circuit view illustrating the ESD protection circuit according to an embodiment of the present inventive concept.

FIG. 2 is a circuit view illustrating a transistor included in a semiconductor device including an ESD protection circuit according to an embodiment of the present inventive concept, FIG. 3 is a layout view illustrating an ESD protection circuit according to an embodiment of the present inventive concept, FIG. 4 is a cross-sectional view taken along the lines A-A and B-B of FIG. 3, FIG. 5 is a cross-sectional view taken along the line C-C of FIG. 3, and FIG. 6 is a circuit view illustrating the ESD protection circuit according to an embodiment of the present inventive concept.

Referring to FIG. 2, a circuit view of a GGNMOS 10 included in the semiconductor device according to the one embodiment is illustrated. In the GGNMOS 10, a gate G and a source S of the transistor may be short-circuited. The GGNMOS 10 may be used in the pull-down circuits 10 and 30 of the ESD protection circuit. A drain D of the GGNMOS 10 may be connected to a port of the power supply VDD and a source S of the GGNMOS 10 may be connected to a port of the ground GND, but aspects of the present inventive concept are not limited thereto.

Only one transistor is illustrated in FIG. 2, but aspects of the present inventive concept are not limited thereto. The semiconductor device according to the present disclosure may include a plurality of transistors having the same circuit connection.

Referring to FIGS. 3 to 6, the GGNMOS 10 according to an embodiment of the present inventive concept includes a substrate 100, a plurality of fins F1 to F4, a gate electrode 120, a channel region III, a source region I, and a drain region II.

The plurality of fins F1 to F4 may be disposed on the substrate 100 to be parallel with each other. The plurality of fins F1 to F4 may include a first fin F1 to a fourth fin F4, but aspects of the present inventive concept are not limited thereto.

In detail, substrate 100 may include, for example, bulk silicon. Alternatively, the substrate 100 may be a silicon substrate, or a substrate made of other materials selected from the group consisting of, for example, germanium, silicon germanium, indium antimonide, lead telluride compound, indium arsenide, indium phosphide, gallium arsenide, and gallium antimonide.

Alternatively, the substrate 100 may be an epitaxial layer formed on a base substrate. When an active fin is formed using an epitaxial layer formed on a base substrate, the epitaxial layer may include, for example, an element semiconductor material, such as silicon or germanium. In addition, the epitaxial layer may include a compound semiconductor and examples thereof may include, for example, a IV-IV group compound semiconductor or a III-V group compound semiconductor. In detail, the IV-IV group compound semiconductor may include, for example, a binary compound or a ternary compound including at least two elements of carbon (C), silicon (Si), germanium (Ge), and tin (Sn) or a compound doped with a IV group element. The III-V group compound semiconductor may include, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In some embodiments of the present inventive concept, the substrate 100 may be an insulating substrate. In detail, the substrate 100 may be a semiconductor on insulator (SOI) substrate. In this case, a delay time can be reduced while operating the semiconductor device. The substrate 100 may include a P type impurity or an N type impurity.

A plurality of fins F1 to F4 may be disposed on the substrate 100. In some embodiments of the present inventive concept, the plurality of fins F1 to F4 may include the same material as the substrate 100. For example, when the substrate 100 includes silicon (Si), the plurality of fins F1 to F4 may also include silicon, but aspects of the present inventive concept are not limited thereto. In some other embodiments of the present inventive concept, the materials of the substrate 100 and the plurality of fins F1 to F4 may vary according to necessity. Alternatively, the materials of the substrate 100 and the plurality of fins F1 to F4 may be different from each other.

The plurality of fins F1 to F4 may extend in a first direction and may protrude from the substrate 100. In some embodiments of the present inventive concept, the plurality of fins F1 to F4 may be formed by etching portions of the substrate 100, but aspects of the present inventive concept are not limited thereto.

In the illustrated embodiment, the plurality of fins F1 to F4 may have tapered sections having widths gradually increasing downwardly, but aspects of the present inventive concept are not limited thereto. In some embodiments of the present inventive concept, sectional shapes of the plurality of fins F1 to F4 may be changed to rectangles. In some other embodiments of the present inventive concept, sectional shapes of the plurality of fins F1 to F4 may be chamfered. For example, the plurality of fins F1 to F4 may have round corners.

An isolation layer 110 may cover lateral surfaces of the plurality of fins F1 to F4. In some embodiments of the present inventive concept, the isolation layer 110 may be, for example, an insulation layer. In more detail, the isolation layer 110 may include, for example, silicon oxide ($SiO_2$), silicon nitride (SiN), or silicon oxynitride (SiON), but aspects of the present inventive concept are not limited thereto.

In some embodiments of the present inventive concept, the isolation layer 110 may be, for example, a shallow trench isolation (STI), but aspects of the present inventive concept are not limited thereto. In some embodiments of the present inventive concept, the isolation layer 110 may be a deep trench isolation (DTI). For example, the isolation layer 110 may be formed between each of the plurality of fins F1 to F4, and a bottom surface of the isolation layer 110 may be formed to be lower than a bottom surface of the source region I or the drain region II. Embodiments of the present inventive concept do not limit the isolation layer 110 to that illustrated herein.

Each of the plurality of fins F1 to F4 may include a source region I, a drain region II, and a channel region III. The channel region III may be disposed between the source region I and the drain region II.

A gate insulation layer 122 may be formed on the channel region III. In some embodiments of the present inventive concept, the gate insulation layer 122 may include a high-k layer. If the gate insulation layer 122 is a high-k layer, it may include a high-k material. In some embodiments of the present inventive concept, examples of the high-k material may include $HfO_2$, $Al_2O_3$, $ZrO_2$, or $TaO_2$, but aspects of the present inventive concept are not limited thereto.

Although not shown, an interface layer may be formed between the gate insulation layer 122 and the channel region III. The interface layer may prevent interface failures from occurring between the substrate 100 and the gate insulation layer 122. The interface layer may include, for example, a low-k material layer having a dielectric constant (k) of 9 or less, e.g., a silicon oxide layer (k≈4) or a silicon oxynitride layer (k≈4~8 according to the concentration of oxygen and nitrogen atoms). Alternatively, the interface layer (not shown) may include silicate or a combination of layers listed above.

The gate electrode 120 may be formed on the gate insulation layer 122. The gate electrode 120 may also be formed on the channel region III, as shown.

In some embodiments of the present inventive concept, the gate electrode 120 may include a metal gate electrode 120. In detail, the gate electrode 120 may include a highly conductive metal. Examples of the metal may include Al and W, but aspects of the present inventive concept are not limited thereto.

Although not shown, the gate electrode 120 may include a work function layer (not shown) for adjusting a work function of a transistor. The work function layer may include, for example, an N type work function layer, but aspects of the present inventive concept are not limited thereto.

The source region I and the drain region II may be formed at opposite sides of the gate electrode 120. For example, in a case of the GGNMOS 10, the substrate 100 may include a P type impurity, the plurality of fins F1 to F4 may include P type impurities (P-well (PW)), and the source region I and the drain region II may include N type impurities, but aspects of the present inventive concept are not limited thereto.

The source region I may include first epitaxial layers 141a and 131b disposed at one side of the gate electrode 120, second epitaxial layers 143a and 133b disposed to be spaced apart from the first epitaxial layers 141a and 131b, and first doping layers 142a and 132b disposed between the first epitaxial layers 141a and 131b and the second epitaxial layers 143a and 133b.

Likewise, the drain region II may include third epitaxial layers 131a and 141b disposed at the other side of the gate electrode 120, fourth epitaxial layers 133a and 143b disposed to be spaced apart from the third epitaxial layers 131a and 141b, and second doping layers 132a and 142b disposed between the third epitaxial layers 131a and 141b and the fourth epitaxial layers 133a and 143b.

In one embodiment, the first epitaxial layers 141a and 131b to the fourth epitaxial layers 133a and 143b, included in the source region I and the drain region II, may be formed by, for example, an epitaxial growth process. After recesses are formed in the plurality of fins F1 to F4, the first epitaxial layers 141a and 131b to the fourth epitaxial layers 133a and 143b may be grown in the formed recesses. The grown first epitaxial layers 141a and 131b to the grown fourth epitaxial layers 133a and 143b may have various shapes. For example, each of the first epitaxial layers 141a and 131b to the fourth epitaxial layers 133a and 143b may be at least one shape of a diamond, a circle and a rectangle.

For example, in the GGNMOS 10 according to an embodiment of the present inventive concept, the first epitaxial layers 141a and 131b to the fourth epitaxial layers 133a and 143b may include the same material with the substrate 100 or a tensile stress material. For example, when the substrate 100 includes Si, an elevated source/drain 161 may include Si or a material having a smaller lattice constant than Si (e.g., SiC).

In detail, the first epitaxial layers 141a and 131b and the third epitaxial layers 131a and 141b may be formed to contact opposite sides of the channel region III. As the first epitaxial layers 141a and 131b and the third epitaxial layers 131a and 141b have polygonal shapes, distances between each of the first epitaxial layers 141a and 131b and each of the third epitaxial layers 131a and 141b may decrease downwardly from a top portion to a bottom portion of the channel region III. Therefore, portions of the first epitaxial layers 141a and 131b and the third epitaxial layers 131a and 141b may overlap the gate electrode 120 or the gate insulation layer 122, and the first epitaxial layers 141a and 131b and the third epitaxial layers 131a and 141b may be positioned under the gate electrode 120 or the gate insulation layer 122.

The second epitaxial layers 143a and 133b may be formed to be spaced apart from the first epitaxial layers 141a and 131b. In addition, the first doping layers 142a and 132b may be disposed between the first epitaxial layers 141a and 131b and the second epitaxial layers 143a and 133b. The first doping layers 142a and 132b may be formed by performing an ion implantation (IIP) process.

Likewise, the fourth epitaxial layers 133a and 143b may be formed to be spaced apart from the third epitaxial layers 131a and 141b. In addition, the second doping layers 132a and 142b may be disposed between the third epitaxial layers 131a and 141b and the fourth epitaxial layers 133a and 143b. The first doping layers 142a and 132b and the second doping layers 132a and 142b may be formed by performing an ion implantation (IIP) process. Bottom surfaces of the first doping layers 142a and 132b and the second doping layers 132a and 142b may be formed to be lower than bottom surfaces of the first epitaxial layers 141a and 131b to the fourth epitaxial layers 133a and 143b, but aspects of the present inventive concept are not limited thereto.

The first doping layers 142a and 132b and the second doping layers 132a and 142b may be formed to be longer than the channel region III of the fins F1 and F2, and the first doping layers 142a and 132b and the second doping layers 132a and 142b may perform a ballast resistance (BR) function. In this case, the GGNMOS 10 may perform an electrostatic discharge (ESD) for preventing a surge from being applied to the source contact plugs 154 and 151 or the drain contact plugs 161 and 164 by the operation of a bipolar junction transistor (BJT) consisting of the first epitaxial layers 141a and 131b, the channel region III, and the second epitaxial layers 143a and 133b.

In the GGNMOS 10 according to the present inventive concept, the source region I and the drain region II may include N type impurities. The source region I and the drain region II may include, for example, silicon (Si) or silicon carbide (SiC). In this case, tensile stress may be applied to the channel region III disposed between the source region I and the drain region, thereby improving operating characteristics of a transistor. In addition, the tensile stress applied to the channel region III may be easily controlled by adjusting an amount of germanium (Ge) included in the channel region III.

In addition, the source contact plugs 154 and 151 may be formed on the second epitaxial layers 143a and 133b and the drain contact plugs 161 and 164 may be formed on fourth epitaxial layers 133a and 143b.

In the GGNMOS 10, the source contact plugs 151 and 152 and the drain contact plugs 161 and 162 may be alternately disposed at one side of the gate electrode 120. For example, the source region I of the first fin F1, the drain region II of the second fin F2, the source region I of the third fin F3, and the drain region II of the fourth fin F4 may be sequentially disposed at one side of the gate electrode 120. Accordingly, the source contact plugs 151 and 152 and the drain contact plugs 161 and 162 may be alternately disposed.

In one embodiment, the source region I of the first fin F1 and the drain region II of the second fin F2 may be disposed at one side of the gate electrode 120, and the drain region II of the first fin F1 and the source region I of the second fin F2 may be disposed at the other side of the gate electrode 120.

As the source region I and the drain region II for each of the plurality of fins F1 to F4 are alternately disposed, the source region of the first fin F1 and the drain region II of the second fin F2, which are adjacent to each other, may function as parasitic NPN transistors. Accordingly, additional current paths may be formed between the source region I of the first fin F1 and the drain region II of the second fin F2, which are adjacent to each other, thereby performing an ESD function for preventing a surge from being applied to the source contact plugs 151 to 154 or the drain contact plugs 161 to 164. The additional current paths are formed at opposite sides of each fin, thereby performing an ESD function for preventing a high surge from being applied to the opposite sides of each fin.

Referring again to FIG. 3, the gate electrode 120 is formed in a direction crossing the first fin F1 and the second fin F2 disposed on the substrate 100 to be parallel with each other. The source region I of the first fin F1 and the drain region II of the second fin F2 may be disposed at one side of the gate electrode 120 and the drain region II of the first fin F1 and the source region I of the second fin F2 may be disposed at the other side of the gate electrode 120.

The source region I of the first fin F1 and the drain region II of the second fin F2 may be electrically connected to the source wire layer 150, and the drain region II of the first fin F1 and the drain region II of the second fin F2 may be electrically connected to the drain wire layer 160. The source wire layer 150 may include a first wire 160a and a fourth wire 160b, and the drain wire layer 160 may include a second wire 150a and a third wire 150a.

The first wire 160a and the second wire 150a formed to be parallel with the gate electrode 120 may be disposed at one side of the gate electrode 120, and the third wire 150b and the fourth wire 160b formed to be parallel with the gate electrode 120 may be disposed at the other side of the gate electrode 120. Here, the first wire 160a may be electrically connected to the drain region II of the first fin F1, the second wire 150a may be electrically connected to the source region I of the second fin F2, the third wire 150b may be electrically connected to the source region I of the first fin F1 and the second wire 150a, and the fourth wire 160b may be electrically connected to the drain region II of the second fin F2 and the first wire 160a.

The first source contact plug 151 and the first drain contact plug 161 may be disposed at one side of the gate electrode 120 and the second source contact plug 152 and the second drain contact plug 162 may be disposed at the other side of the gate electrode 120, but aspects of the present inventive concept are not limited thereto. The source region I and the drain region II of each of the plurality of fins F1 to F4 disposed at one side of the gate electrode 120 may be alternately disposed.

In addition, the first drain contact plug 161 may be positioned between the first wire 160a and the drain region II of the first fin F1, the first source contact plug 151 may be positioned between the second wire 150a and the source region I of the second fin F2, the second source contact plug 152 may be positioned between the third wire 150b and the source region I of the first fin F1, and the second drain contact plug 162 may be positioned between the fourth wire 160b and the drain region II of the second fin F2, but aspects of the present inventive concept are not limited thereto. The source contact plugs 151 and 152 and the drain contact plugs 161 and 162, disposed at one side of the gate electrode 120, may also be alternately disposed.

The source contact plugs 151 and 152 and the drain contact plugs 161 and 162 disposed at one side of the gate electrode 120 may be positioned on the same line. For example, the first source contact plug 151 formed on the source region I of the first fin F1 and the second drain contact plug 162 formed on the drain region II of the second fin F2 may be disposed on the first line parallel with a direction in which the gate electrode 120 extends. In addition, the first wire 160a may be disposed at one side of the first line and the second wire 150a may be disposed at the other side of the first line. A portion of the first wire 160a may extend toward each of the drain contact plugs 161 and 162. Likewise, a portion of the second wire 150a may extend toward each of the source contact plugs 151 and 152.

In one embodiment, an interlayer insulation layer may be formed on the isolation layer 110. The interlayer insulation layer (not shown) may be formed to cover all of the isolation layer 110, the source region I, the drain region II, and the gate electrode 120. In addition, the source wire layer 150 and the drain wire layer 160 may be disposed on the interlayer insulation layer and the source contact plugs 151 to 154 and the drain contact plugs 161 to 164 may pass through the interlayer insulation layer.

Referring to FIG. 6, the GGNMOS 10 according to the present inventive concept may be illustrated as a circuit view shown in FIG. 6. The GGNMOS 10 according to the present inventive concept may include first to fourth transistors TR1 to TR4, and a gate G and a source S of each of the first to fourth transistors TR1 to TR4 may be electrically connected.

The first and second transistors TR1 and TR2 will now be described by way of example. Each of the first and second transistors TR1 and TR2 may include a source S, a drain D, and a channel disposed between the source S and the drain D. The source S of the first transistor TR1 and the drain D of the second transistor TR2 may be disposed to be adjacent to one side of the gate G.

Accordingly, a first parasitic transistor P1 may be formed between the source S of the first transistor TR1 and the drain D of the second transistor TR2 and a second parasitic transistor P4 may be formed between the drain D of the first transistor TR1 and the source S of the second transistor TR2. The first and second parasitic transistors TR1 and TR2 may be NPN type transistors, but aspects of the present inventive concept are not limited thereto.

Parasitic transistors P1 to P6 may be formed between the source S and the drain of each of the transistors TR1 to TR4, and an additional current path may be formed between the source S and the drain D adjacent to each other. In such a manner, the GGNMOS 10 according to one embodiment may perform the ESD function for preventing a surge from being externally applied. The additional current path may include a plurality of current paths formed at opposite sides of each fin to perform the ESD function for the purpose of preventing a higher level of surge.

Figure 7:
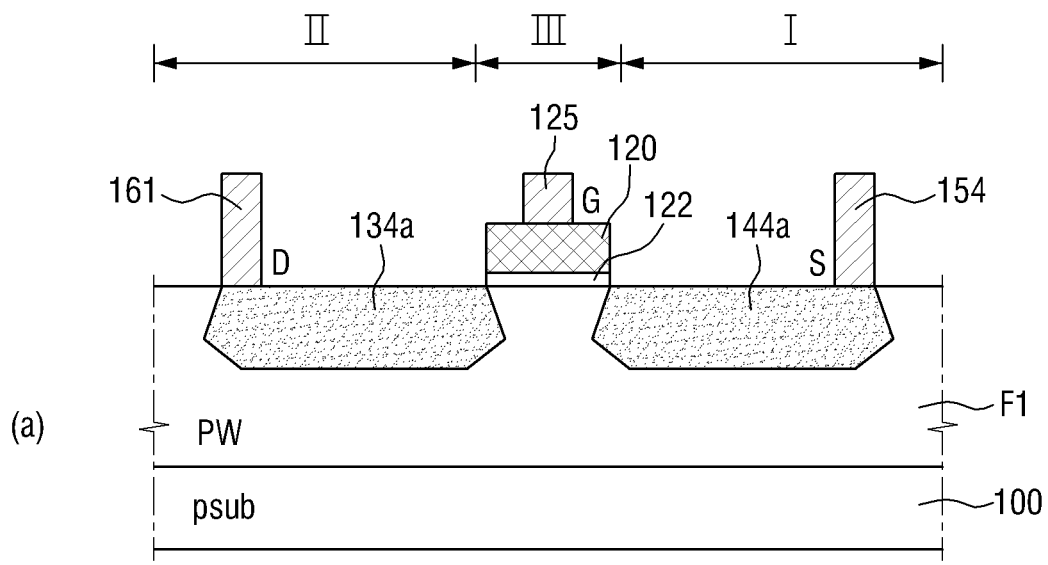
FIG. 7 is a cross-sectional view illustrating an ESD protection circuit according to an embodiment of the present inventive concept.
Figure 7:
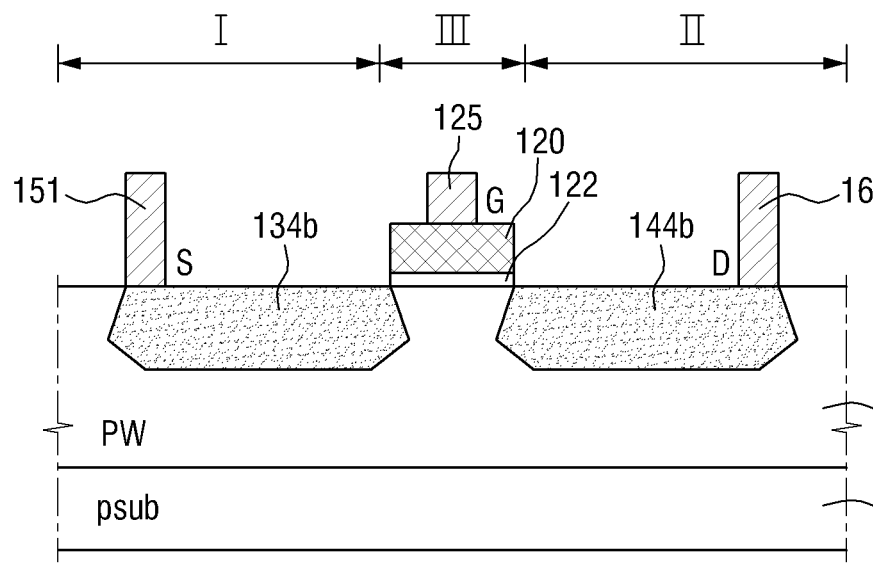

FIG. 7 is a cross-sectional view illustrating an ESD protection circuit according to an embodiment of the present inventive concept. Referring to FIG. 7, in a GGNMOS 11 according to an embodiment of the present inventive concept, a source region I and a drain region II may be formed at opposite sides of a gate electrode 120. The source region I and the drain region II may be formed of a single epitaxial layer. For example, the source region I of the first fin F1 may include first epitaxial layers 144a and 134b and the drain region II may include second epitaxial layers 134a and 144b.

The first epitaxial layers 144a and 134b and the second epitaxial layers 134a and 144b may have various shapes. For example, each of the first epitaxial layers 144a and 134b and the second epitaxial layers 134a and 144b may be at least one shape of a diamond, a circle and a rectangle. In addition, the first epitaxial layers 144a and 134b and the second epitaxial layers 134a and 144b may be formed by an epitaxial growth process and may include the same material with the substrate 100 or a tensile stress material. For example, when the substrate 100 includes Si, the first epitaxial layers 144a and 134b and the second epitaxial layers 134a and 144b may include Si or a material having a smaller lattice constant than Si (e.g., SiC).

In detail, the first epitaxial layers 144a and 134b and the second epitaxial layers 134a and 144b may be formed to contact opposite sides of the channel region III. As the first epitaxial layers 144a and 134b and the second epitaxial layers 134a and 144b have polygonal shapes, distances between each of the first epitaxial layers 144a and 134b and each of the second epitaxial layers 134a and 144b may decrease downwardly from a top portion to a bottom portion of the channel region III. Therefore, portions of the first epitaxial layers 144a and 134b and the second epitaxial layers 134a and 144b may overlap with the gate electrode 120 or the gate insulation layer 122, and the first epitaxial layers 144a and 134b and the second epitaxial layers 134a and 144b may be positioned under the gate electrode 120 or the gate insulation layer 122.

In addition, source contact plugs 151 to 154 may be disposed at one side of the first epitaxial layers 144a and 134b and drain contact plugs 161 to 164 may be disposed at one side of the second epitaxial layers 134a and 144b. The source contact plugs 151 to 154 and the drain contact plugs 161 to 164 may be spaced to be farthest from the gate electrode 120. Accordingly, the first epitaxial layers 144a and 134b and the second epitaxial layers 134a and 144b may perform a ballast resistance (BR) function.

To allow the first epitaxial layers 144a and 134b and the second epitaxial layers 134a and 144b to grow on a substrate 100, one of solid phase epitaxy (SPE), liquid phase epitaxy (LPE) and vapor phase epitaxy (VPE) may be employed. For example, in a semiconductor device manufacturing process, a single crystalline epitaxial layer may be allowed to grow at a temperature in a range of approximately 500° C. to approximately 800° C. using a source gas including silicon (Si), germanium (Ge) or carbide (C). Accordingly, the single crystalline epitaxial layer including silicon germanium (SiGe) or silicon carbide (SiC) is formed on the substrate 100. Thereafter, in order to stabilize the grown single crystalline epitaxial layer, a predetermined heat treatment process may further be performed, but aspects of the present inventive concept are not limited thereto.

Figure 8:
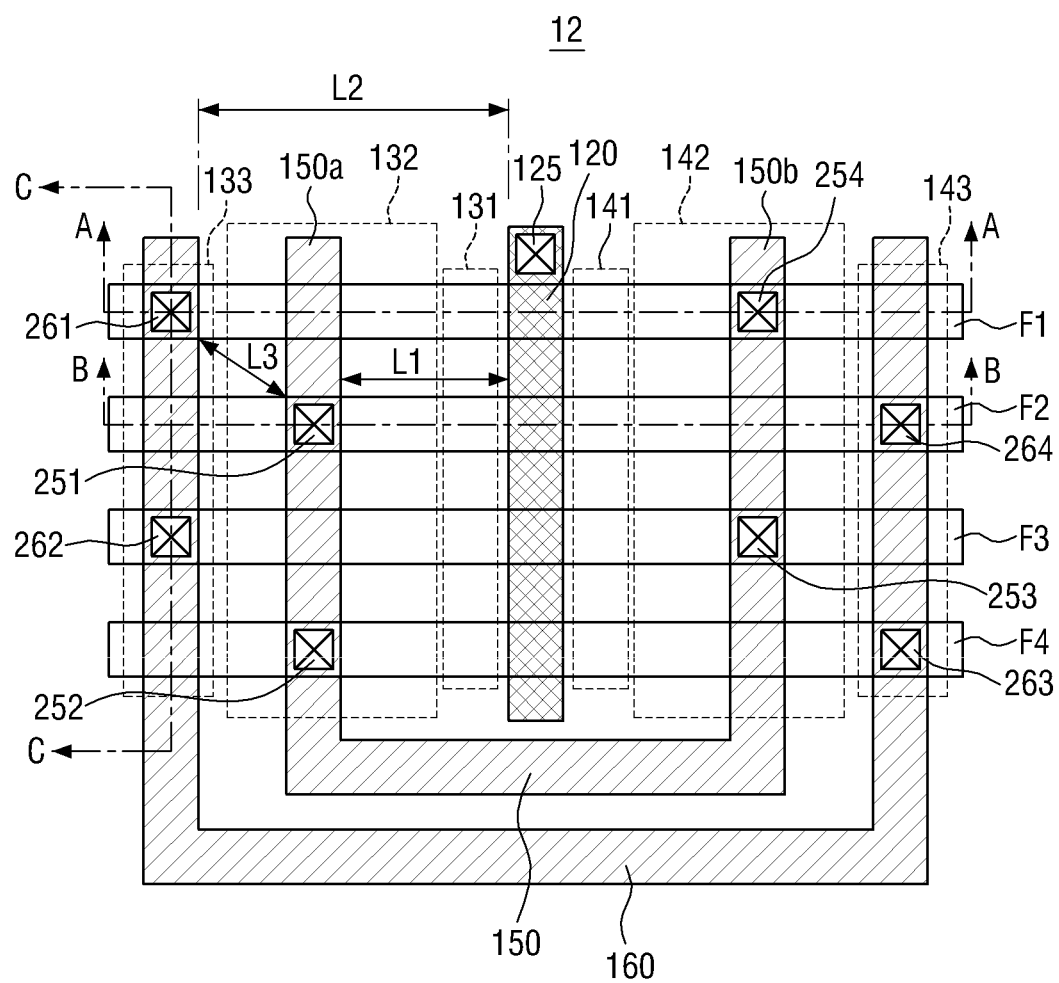
FIG. 8 is a layout view illustrating an ESD protection circuit according to an embodiment of the present inventive concept.
Figure 9:
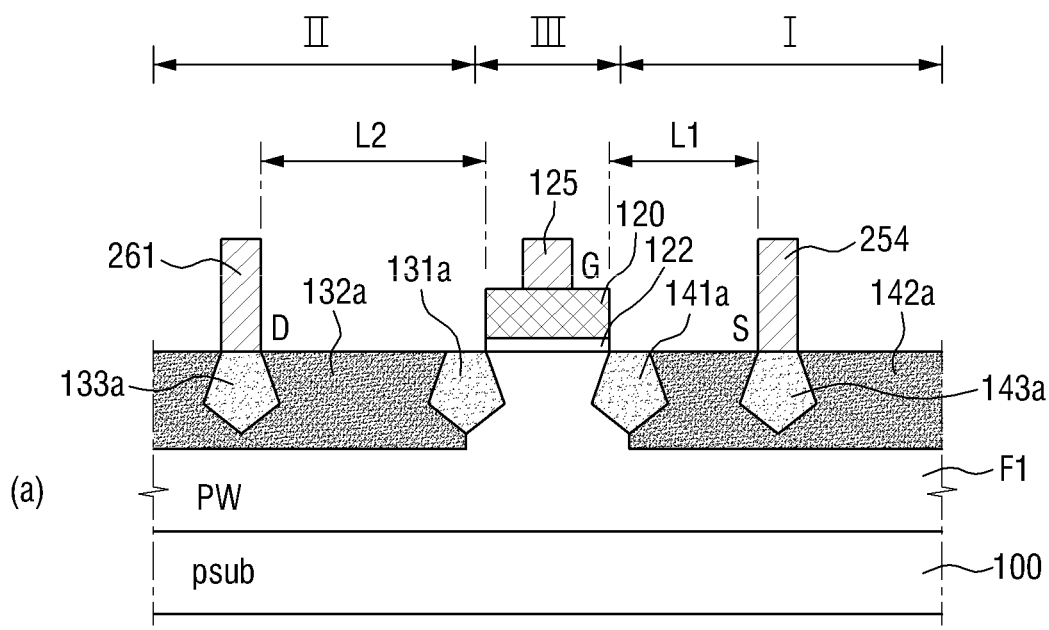
FIG. 9 is a cross-sectional view taken along the lines A-A and B-B of FIG. 8 according to an embodiment of the present inventive concept.
Figure 9:
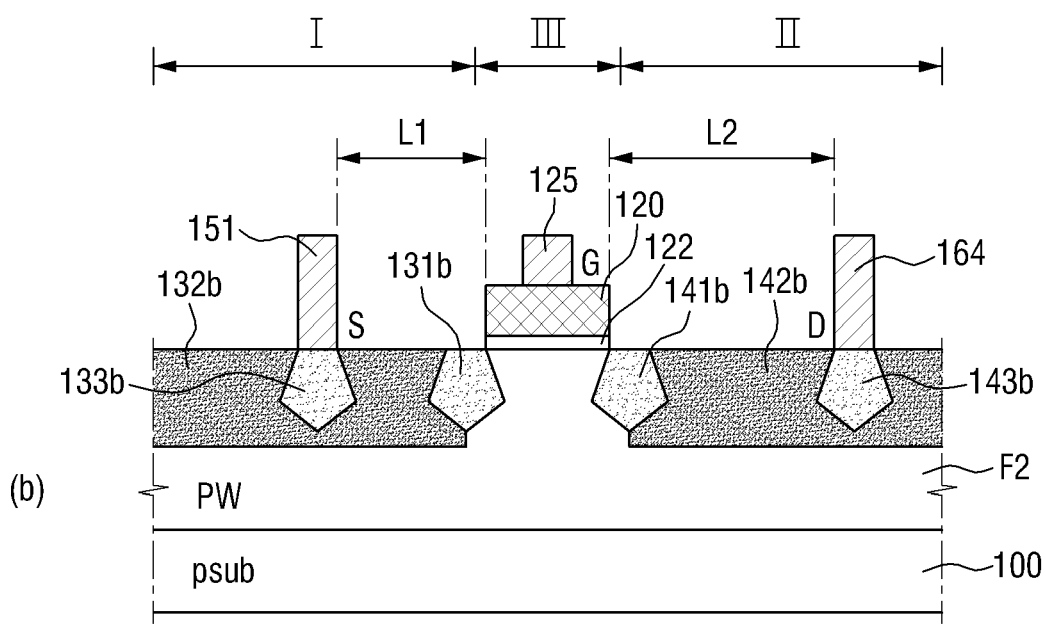
Figure 10:
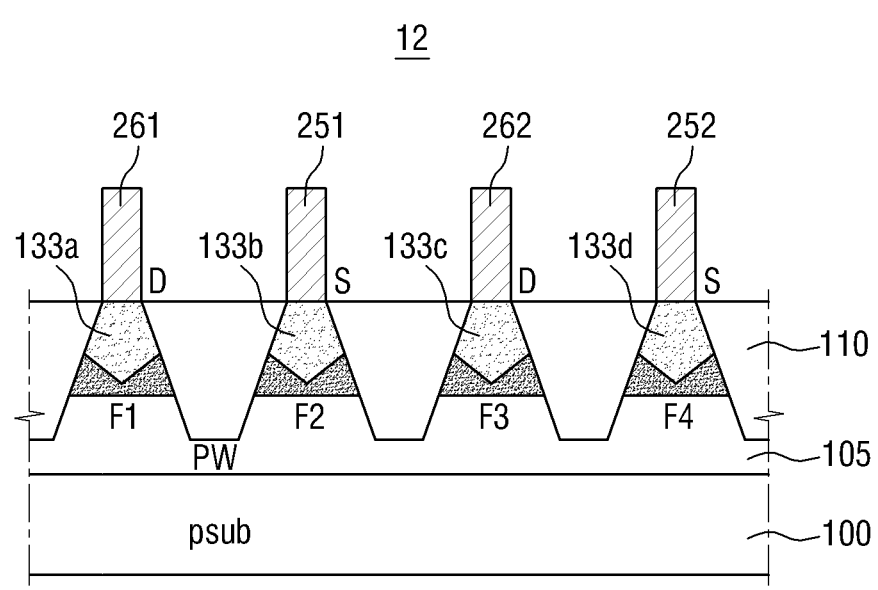
FIG. 10 is a cross-sectional view taken along the line C-C of FIG. 8 according to an embodiment of the present inventive concept.

FIG. 8 is a layout view illustrating an ESD protection circuit according to an embodiment of the present inventive concept, FIG. 9 is a cross-sectional view taken along lines A-A and B-B of FIG. 8 and FIG. 10 is a cross-sectional view taken along the line C-C of FIG. 8. Referring to FIGS. 8 to 10, a GGNMOS 12 according to an embodiment of the present inventive concept may be formed in substantially the same manner with the GGNMOS 10 shown in FIGS. 3 to 6. In detail, the cross-sectional view taken along the line C-C of FIG. 8 may be substantially the same with the cross-sectional view of FIG. 5.

However, in the GGNMOS 12 according to one embodiment of the present inventive concept, a first distance L1 between the gate electrode 120 and each of the source contact plugs 251 to 254 and a second distance L2 between gate electrode 120 and each of the drain contact plugs 261 to 264 may be different from each other.

In detail, the fourth epitaxial layers 133a and 143b of the source region I may be disposed to be closer to the gate electrode 120 than the second epitaxial layers 143a and 133b of the drain region II. Accordingly, the drain contact plugs 261 to 264 formed on the fourth epitaxial layers 133a and 143b may be disposed to be farther from the gate electrode 120 than the source contact plugs 251 to 254 formed on the second epitaxial layers 143a and 133b.

Referring to FIG. 9, both of a first fin F1 of FIG. 9(a) and a second fin F2 of FIG. 9(b) may have the same distance between the gate electrode 120 and each of the source contact plugs 251 to 254. That is to say, in the plurality of fins F1 to F4, both of the source contact plugs 251 to 254 may be disposed to be closer to the gate electrode 120 and distances between the gate electrode 120 and the source contact plugs 251 to 254 are the same with each other. Accordingly, the respective transistors formed in the plurality of fins F1 to 4 may have the same characteristics, but aspects of the present inventive concept are not limited thereto.

The source region I of the first fin F1 and the drain region II of the second fin F2 may be disposed at one side of the gate electrode 120 and the drain region II of the first fin F1 and the source region I of the second fin F2 may be disposed at the other side of the gate electrode 120. Since a distance L1 between the gate electrode 120 and each of the source contact plugs 251 to 254 is smaller than a distance L2 between the gate electrode 120 and each of the drain contact plugs 261 to 264, a distance L3 between a source contact plug (e.g., 251) and a drain contact plug (e.g., 261) disposed at one side of the gate electrode 120 may be increased, compared to a case of the embodiment shown in FIGS. 3 to 6.

The first fin F1 and the second fin F2 disposed on the substrate 100 to be parallel with each other will now be described in detail with reference to FIG. 8. The gate electrode 120 is formed on the substrate 100 in a direction crossing the first and second fins F1 and F2.

The source region I of the first fin F1 and the source region I of the second fin F2 may be electrically connected to a source wire layer 250, and the drain region II of the first fin F1 and the drain region II of the second fin F2 may be electrically connected to a drain wire layer 260. The source wire layer 250 may include a first wire 160a and a fourth wire 160b and the drain wire layer 260 may include a second wire 150a and a third wire 150b.

The first wire 160a and the second wire 150a formed to be parallel with the gate electrode 120 may be disposed at one side of the gate electrode 120 and the third wire 150b and the fourth wire 160b formed to be parallel with the gate electrode 120 may be disposed at the other side of the gate electrode 120. Here, the first wire 160a may be electrically connected to the drain region II of the first fin F1, the second wire 150a may be electrically connected to the source region I of the second fin F2, the third wire 150b may be electrically connected to the source region I of the first fin F1 and the second wire 150a, and the fourth wire 160b may be electrically connected to the drain region II of the second fin F2 and the first wire 160a. The first source contact plug 251 and the first drain contact plug 261 may be disposed at one side of the gate electrode 120 and the second source contact plug 252 and the second drain contact plug 262 may be disposed at the other side of the gate electrode 120, but aspects of the present inventive concept are not limited thereto. The source region I and the drain region II of each of the plurality of fins F1 to F4, disposed at one side of the gate electrode 120, may be alternately disposed.

In addition, the first drain contact plug 261 may be positioned between the first wire 160a and the drain region II of the first fin F1, the first source contact plug 251 may be positioned between the second wire 150a and the source region I of the second fin F2, the second source contact plug 252 may be positioned between the third wire 150b and the source region I of the first fin F1, and the second drain contact plug 262 may be positioned between the fourth wire 160b and the drain region II of the second fin F2, but aspects of the present inventive concept are not limited thereto. The source contact plugs 251 to 254 and the drain contact plugs 261 to 264, disposed at one side of the gate electrode 120, may also be alternately disposed.

The source contact plugs 251 to 254 and the drain contact plugs 261 to 264, disposed at one side of the gate electrode 120, may be positioned on another line. For example, the first source contact plug 251 may be positioned on a first line parallel with a direction in which the gate electrode 120 extends and the first drain contact plug 261 may be positioned on a second line parallel with the first line and different from the first line. Here, the first line and the second line may be disposed at one side of the gate electrode 120. The first line may be positioned to be closer to the gate electrode 120 than the second line, but aspects of the present inventive concept are not limited thereto.

Accordingly, an increased space required for forming the source contact plugs 251 to 254 and the drain contact plugs 261 to 264 can be secured while reducing the processing volume. In addition, it is possible to reduce failures that may be generated when the source contact plugs 251 to 254 and the drain contact plugs 261 to 264 are formed, but aspects of the present inventive concept are not limited thereto.

In one embodiment, an isolation layer 110 may be formed on external portions of the first epitaxial layers 141*a* and 131*b* and the fourth epitaxial layers 133*a* and 143*b* (that is, portions positioned to be far from the gate electrode 120). The isolation layer 110 may be STI or DTI, but aspects of the present inventive concept are not limited thereto.

Figure 11:
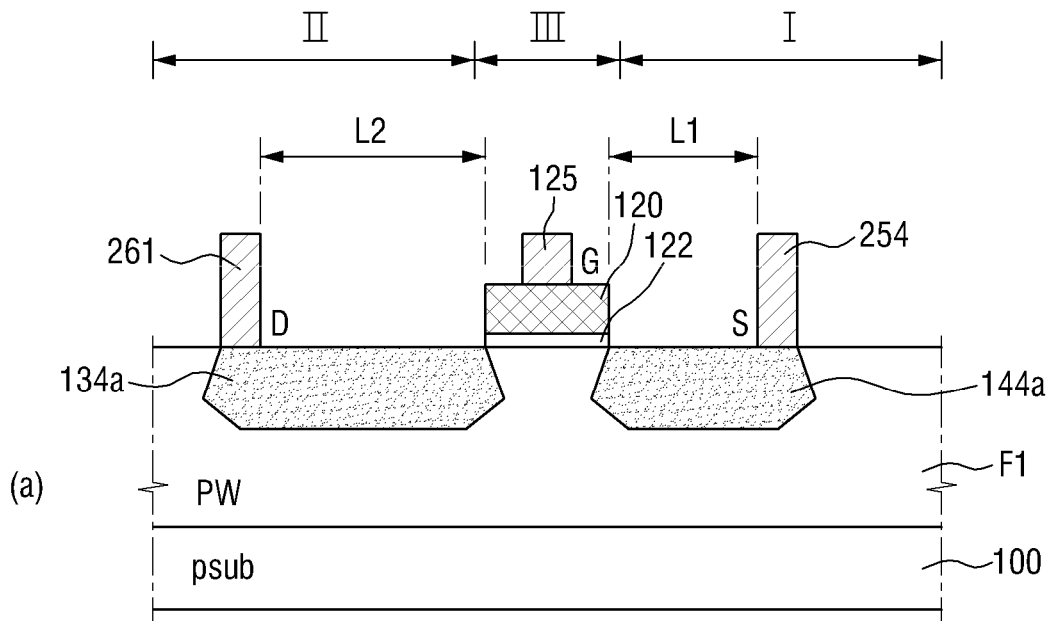
FIG. 11 is a cross-sectional view illustrating an ESD protection circuit according to an embodiment of the present inventive concept.
Figure 11:
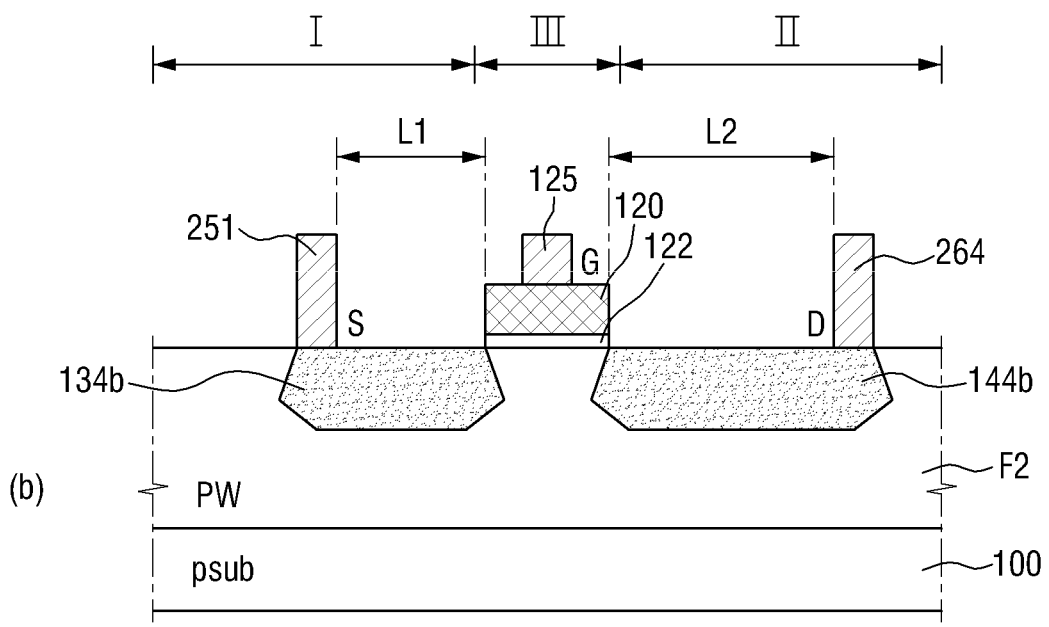

FIG. 11 is a cross-sectional view illustrating an ESD protection circuit according to an embodiment of the present inventive concept.

Referring to FIG. 11, a GGNMOS 13 according to an embodiment of the present inventive concept may be formed in substantially the same manner with the GGNMOS 11 shown in FIG. 7. In the GGNMOS 13, a source region I and a drain region II may be formed at opposite sides of a gate electrode 120. The source region I and the drain region II may be formed of a single epitaxial layer. For example, the source region I of the first fin F1 may include first epitaxial layers 141*a* and 131*b* and the drain region II may include second epitaxial layers 143*a* and 133*b*. However, a length L1 of each of the first epitaxial layers 141*a* and 131*b* may be smaller than a length L2 of each of the second epitaxial layers 143*a* and 133*b*.

In addition, source contact plugs 251 and 252 may be disposed at one side of the first epitaxial layers 141*a* and 131*b* and drain contact plugs 261 and 262 may be disposed at one side of the second epitaxial layers 143*a* and 133*b*. The source contact plugs 151 and 152 and the drain contact plugs 161 and 162 may be spaced to be farthest from the gate electrode 120. Accordingly, the source contact plugs 161 and 162 may be positioned to be closer to the gate electrode 120 than the drain contact plugs 261 and 262. However, distances between the gate electrode 120 and the source contact plugs 151 and 152 may be maintained to be the same in the first fin F1 and the second fin F2.

Figure 12:
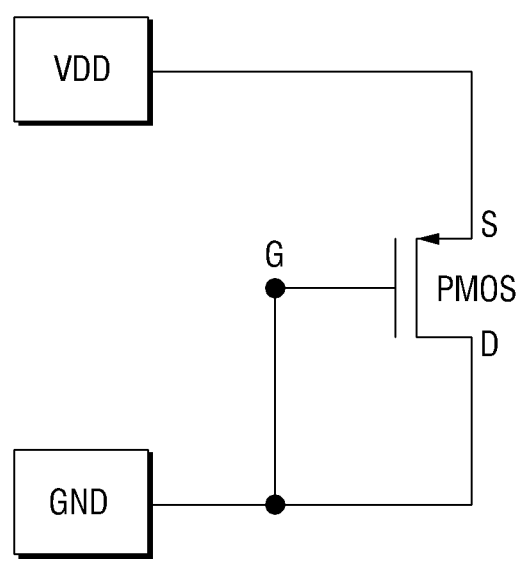
FIG. 12 is a circuit view illustrating an ESD protection circuit according to an embodiment of the present inventive concept.

FIG. 12 is a circuit view illustrating an ESD protection circuit according to an embodiment of the present inventive concept. Referring to FIG. 12, a circuit view of a GGPMOS 15 included in the semiconductor device according to the present inventive concept is illustrated. In the GGPMOS 15, a gate G and a source S of the transistor may be short-circuited. The GGPMOS 15 may be used in pull-up circuits 15 and 35 of the ESD protection circuit. A drain D of the GGPMOS 15 may be connected to a port of the power supply VDD and a source S of the GGPMOS 15 may be connected to a port of the ground GND, but aspects of the present inventive concept are not limited thereto.

In addition, only one transistor is illustrated in FIG. 12, but aspects of the present inventive concept are not limited thereto. The semiconductor device according to the present disclosure may include a plurality of transistors having the same circuit connection.

In an embodiment, a substrate 100 of the GGPMOS 15 may include a P type impurity, a plurality of fins F1 to F4 may include N type impurities (N-well; NW), and the source region I and the drain region II may include P type impurities, but aspects of the present inventive concept are not limited thereto.

Figure 13:
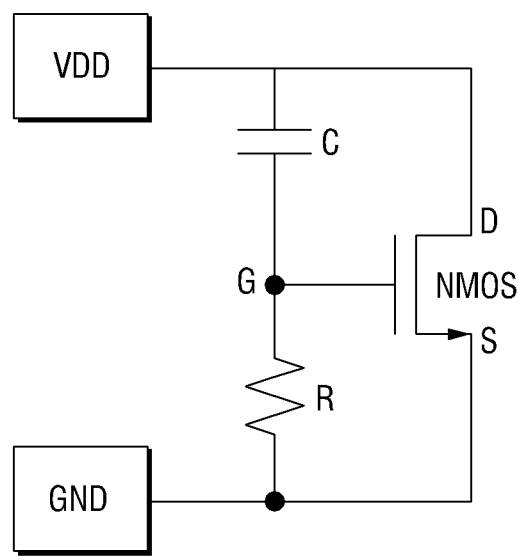
FIG. 13 is a circuit view illustrating an ESD protection circuit according to an embodiment of the present inventive concept.
Figure 14:
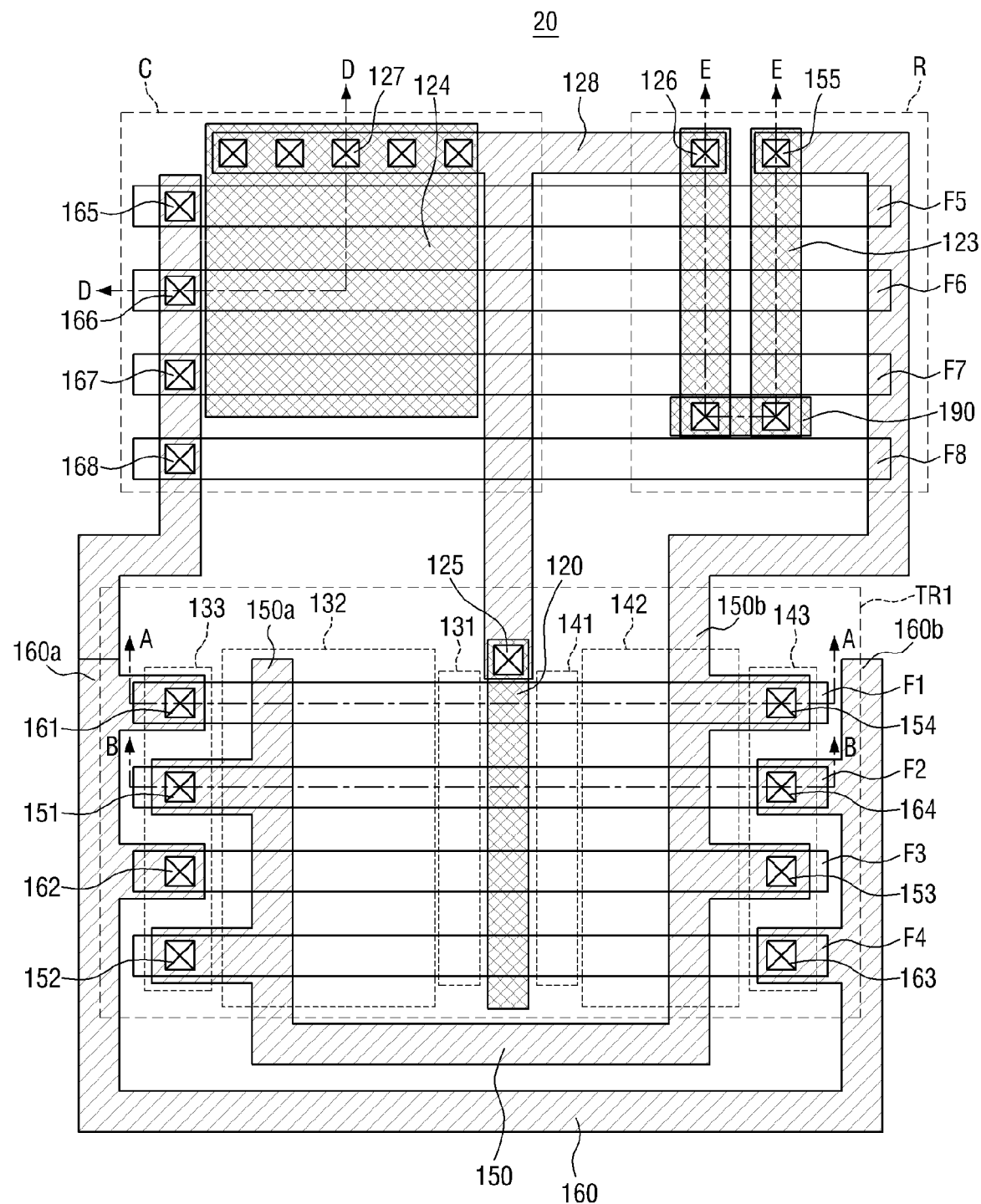
FIG. 14 is a layout view illustrating the ESD protection circuit according to an embodiment of the present inventive concept.
Figure 15:
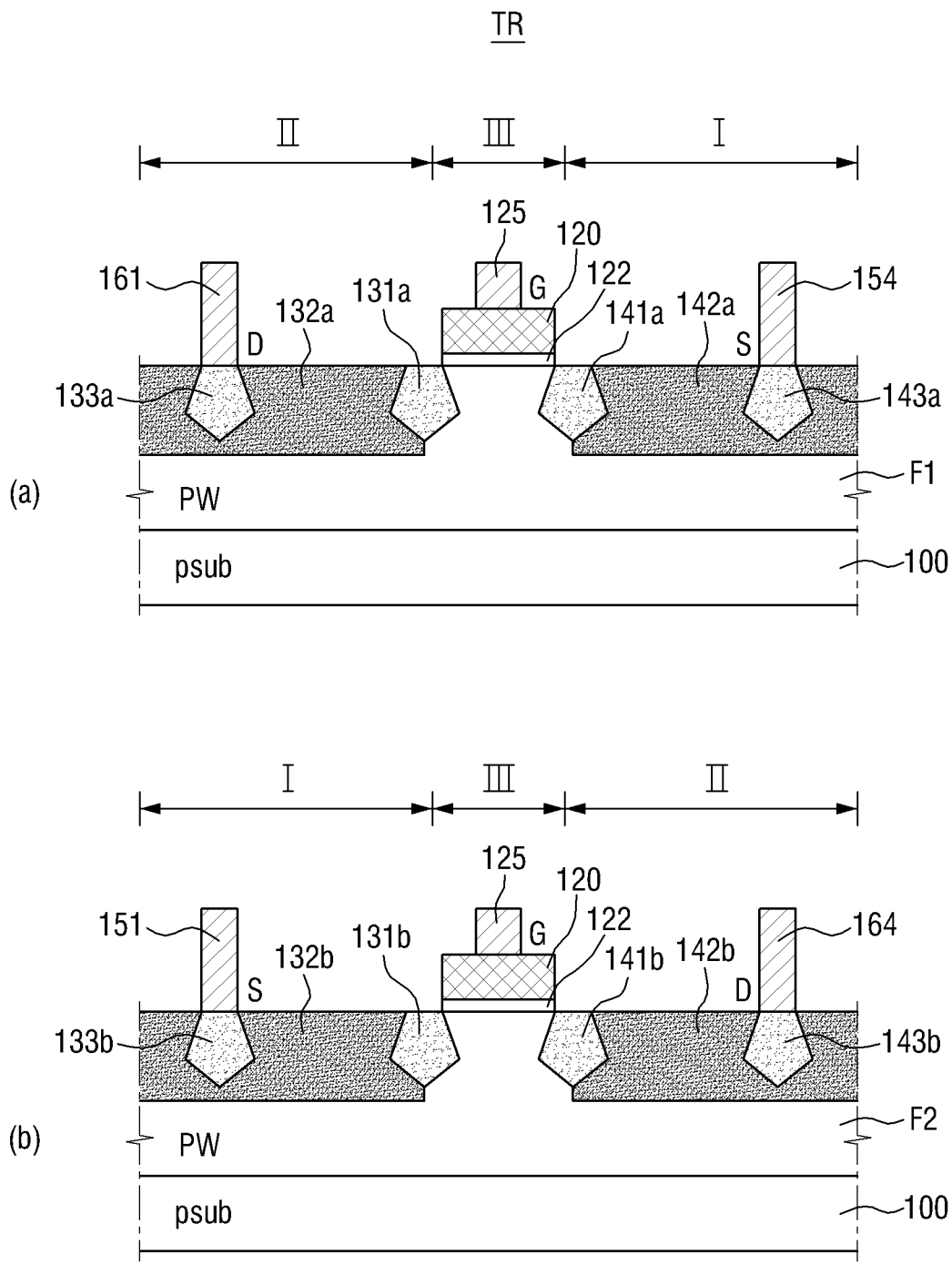
FIG. 15 is a cross-sectional view taken along the lines A-A and B-B of FIG. 14 according to an embodiment of the present inventive concept.
Figure 16:
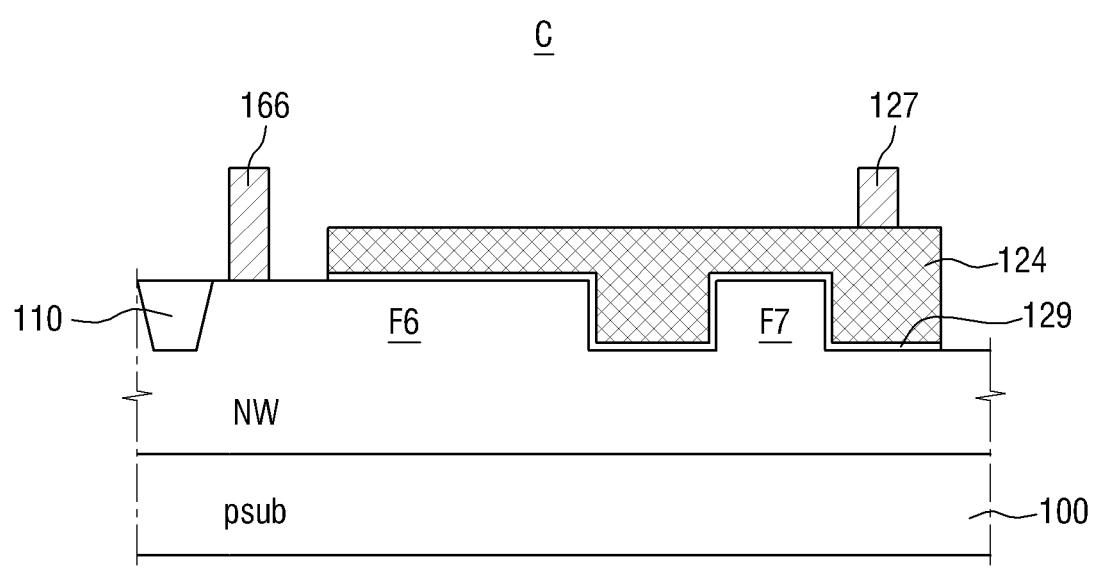
FIG. 16 is a cross-sectional view taken along the line D-D of FIG. 14 according to an embodiment of the present inventive concept.
Figure 17:
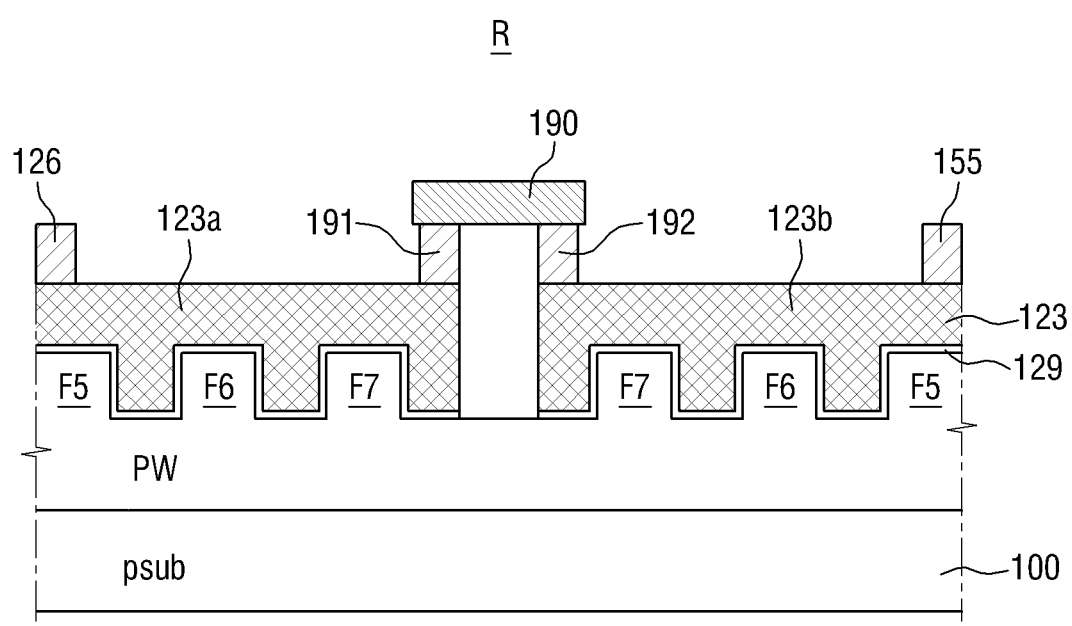
FIG. 17 is a cross-sectional view taken along the line E-E of FIG. 14 according to an embodiment of the present inventive concept.

FIG. 13 is a circuit view illustrating an ESD protection circuit according to an embodiment of the present inventive concept, FIG. 14 is a layout view illustrating the ESD protection circuit according to an embodiment of the present inventive concept, FIG. 15 is a cross-sectional view taken along lines A-A and B-B of FIG. 14, FIG. 16 is a cross-sectional view taken along the line D-D of FIG. 14 and FIG. 17 is a cross-sectional view taken along the line E-E of FIG. 14. Referring to FIG. 13, a circuit view of a GCNMOS 20 included in the semiconductor device according to one embodiment is illustrated. In the GCNMOS 20, a resistor R may be connected between a gate G and a source S of a transistor. In addition, a capacitor C may be connected between the gate G and a drain D. The GCNMOS 20 may be used in a power clamp circuit 20 of an ESD protection circuit. The drain D of the GCNMOS 20 may be connected to a port of a power supply VDD and the source S of the GCNMOS 20 may be connected to a port of the ground GND, but aspects of the present inventive concept are not limited thereto.

In addition, only one transistor is illustrated in FIG. 13, but aspects of the present inventive concept are not limited thereto. The semiconductor device according to the present disclosure may include a plurality of transistors having the same circuit connection.

Referring to FIGS. 14 and 15, the GCNMOS 20 according to the sixth embodiment of the present inventive concept may include a transistor TR1, a capacitor C and a resistor R.

The transistor TR1 of the GCNMOS 20 may be substantially the same with that of the GGNMOS 10 shown in FIGS. 3 to 6. For example, sectional shapes taken along the lines A-A and B-B of FIG. 15 may be substantially the same with the sectional shape of FIG. 4 and detailed descriptions thereof are the same with those of the previous embodiments and will not be given.

Referring to FIGS. 14 and 16, the capacitor C may include a plurality of fins F5 to F8, a second gate electrode 124, a drain wire layer 160, and a gate wire layer 129.

The plurality of fins F5 to F8 may extend in a first direction and may protrude from a substrate 100. In some embodiments of the present inventive concept, the plurality of fins F5 to F8 may be formed by etching portions of the substrate 100, but aspects of the present inventive concept are not limited thereto.

In some embodiments of the present inventive concept, the plurality of fins F5 to F8 may include the same material as the substrate 100. For example, when the substrate 100 includes silicon (Si), the plurality of fins F5 to F8 may also include silicon, but aspects of the present inventive concept are not limited thereto. In some other embodiments of the present inventive concept, the materials of the substrate 100 and the plurality of fins F5 to F8 may vary according to necessity. For example, in some other embodiments of the present inventive concept, the substrate 100 and the plurality of fins F5 to F8 may include different materials.

The second gate electrode 124 may be formed on the plurality of fins F5 to F8. The second gate electrode 124 may be formed to cover portions of the plurality of fins F5 to F8 but may be formed to be wider than the gate electrode 120 of the transistor TR1. A portion of the second gate electrode 124 may overlap with the gate wire layer 128.

The drain wire layer 160 may be disposed in a direction crossing the plurality of fins F5 to F8. For example, the drain wire layer 160 may be disposed to be perpendicular to the plurality of fins F5 to F8. Drain contact plugs 165 to 168 may be formed between the drain wire layer 160 and the plurality of fins F5 to F8. The second gate electrode 124 may be formed at one side of the drain wire layer 160 to be spaced apart from the drain wire layer 160. A shallow trench isolation (STI) may be formed at one side of the drain wire layer 160, but aspects of the present inventive concept are not limited thereto.

A gate contact plug 127 may be disposed on the second gate electrode 124. The gate contact plug 127 may be disposed between the second gate electrode 124 and the gate wire layer 128.

The gate contact plug 125 and the drain contact plugs 161 to 164 may function as first and second electrodes of the capacitor C, and the plurality of fins F5 to F8 and the second gate electrode 124 may be two facing plates included in the capacitor C. An insulation layer 129 may be disposed to prevent current from flowing between the plurality of fins F5 to F8 and the second gate electrode 124, but aspects of the present inventive concept are not limited thereto.

Referring to FIGS. 14 and 17, the resistor R may include a plurality of fins F5 to F8, a third gate electrode 123, a source wire layer 150, and a gate wire layer 128.

The third gate electrode 123 may be formed on the plurality of fins F5 to F8 in a direction crossing the plurality of fins F5 to F8. The third gate electrode 123 may include a plurality of partial gate electrodes 123a and 123b. The plurality of partial gate electrodes 123a and 123b may be spaced apart from each other in parallel, and may be electrically connected through a first connection port 191, a second connection port 192 and a connection layer 190. In the illustrated embodiment, only two partial gate electrodes 123a and 123b are connected, but aspects of the present inventive concept are not limited thereto. As a connection length between the partial gate electrodes 123a and 123b is increased, the resistor R may have an increased size.

A gate contact plug 126 connected to the gate wire layer 129 may be disposed at one end of the first partial gate electrode 123a. A drain contact plug 155 connected to the drain wire layer 160 may be disposed at one end of the second partial gate electrode 123b.

The capacitor C may be disposed in a region including an N type impurity and the resistor R and the transistor TR1 may be disposed in regions including an N type impurity, but aspects of the present inventive concept are not limited thereto.

The product of a capacitor value 'C' and a resistor value 'R' is referred to as a RC time constant. When the capacitor value 'C', the resistor value 'R' and an ESD voltage are fixed, a voltage applied to the gate G of the transistor TR1 of the GCNMOS 20 may decrease in an exponential function manner according to passage of time 't'. Therefore, the GCNMOS 20 according to the present inventive concept may perform a clamping operation of the ESD protection circuit for a long time as the RC time constant increases.

Figure 18:
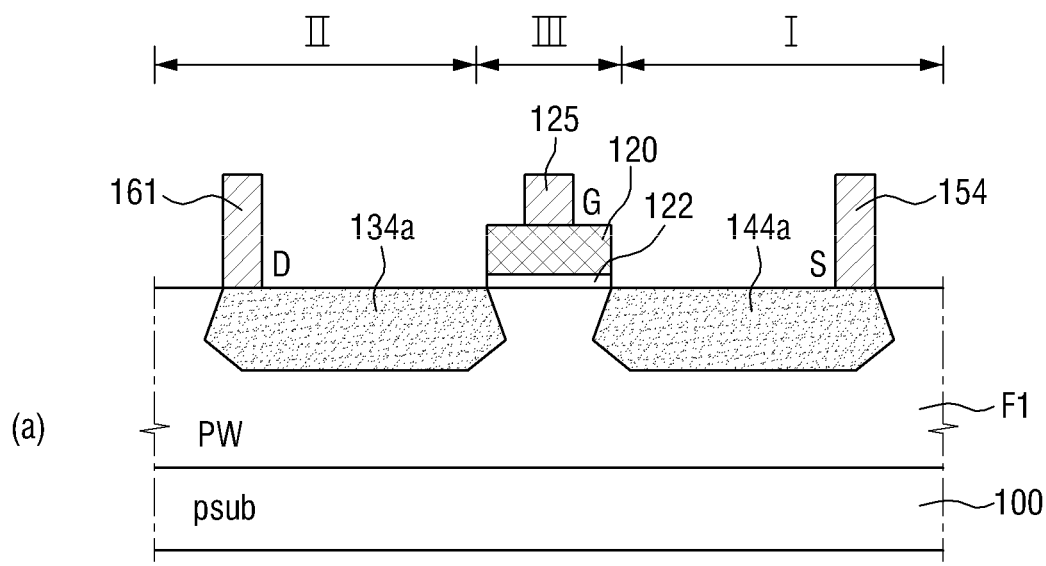
FIG. 18 is a layout view illustrating an ESD protection circuit according to an embodiment of the present inventive concept.
Figure 18:
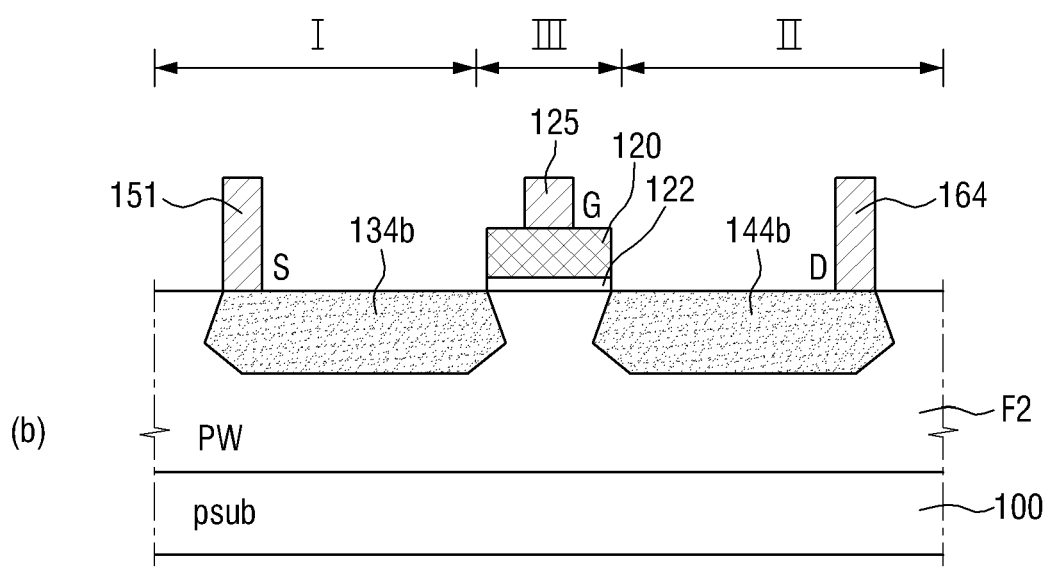

FIG. 18 is a layout view illustrating an ESD protection circuit according to an embodiment of the present inventive concept.

Referring to FIG. 18, a GCNMOS 21 according to the seventh embodiment of the present inventive concept may include a transistor TR1, a capacitor C and a resistor R.

The transistor TR1 of the GCNMOS 21 may be substantially the same with the GGNMOS 11 shown in FIG. 7.

The capacitor C and the resistor R of the GCNMOS 21 may be substantially the same with those included in the GGNMOS 20 shown in FIGS. 14 to 17 and detailed descriptions thereof are the same with those of the previous embodiments and will not be given.

Figure 19:
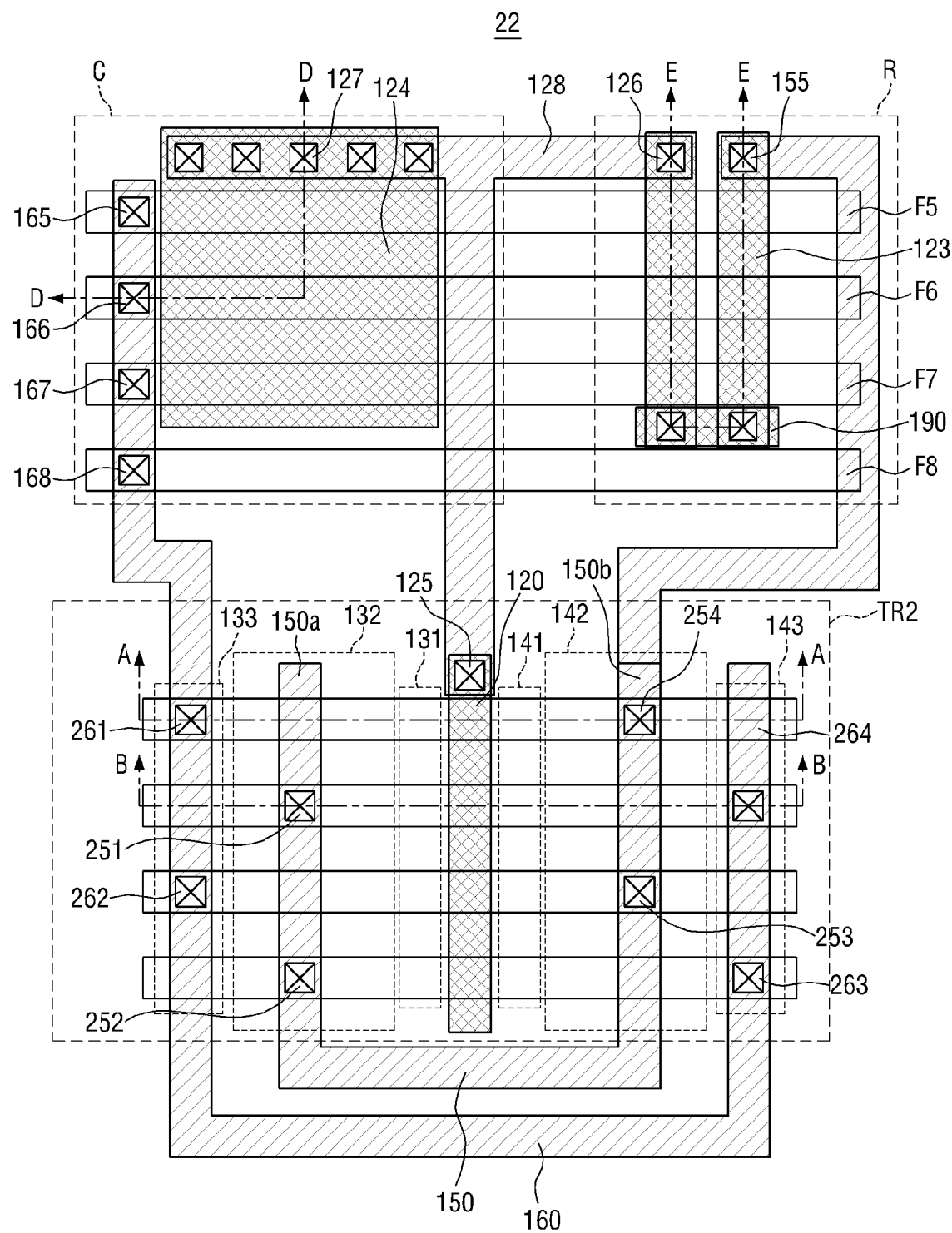
FIG. 19 is a layout view illustrating an ESD protection circuit according to an embodiment of the present inventive concept.
Figure 20:
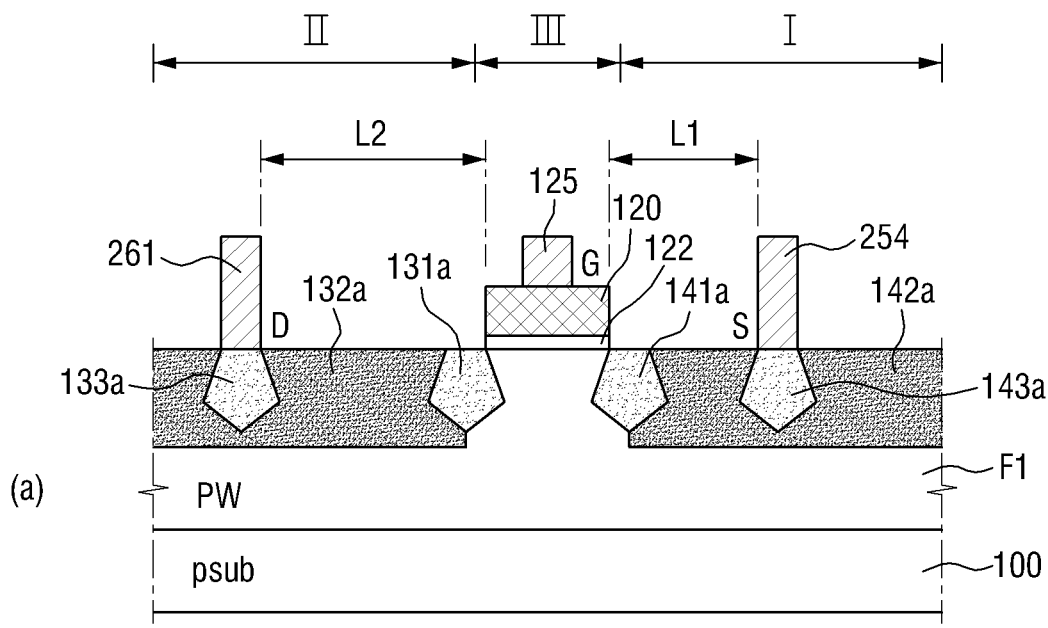
FIG. 20 is a cross-sectional view taken along the lines A-A and B-B of FIG. 19 according to an embodiment of the present inventive concept.
Figure 20:
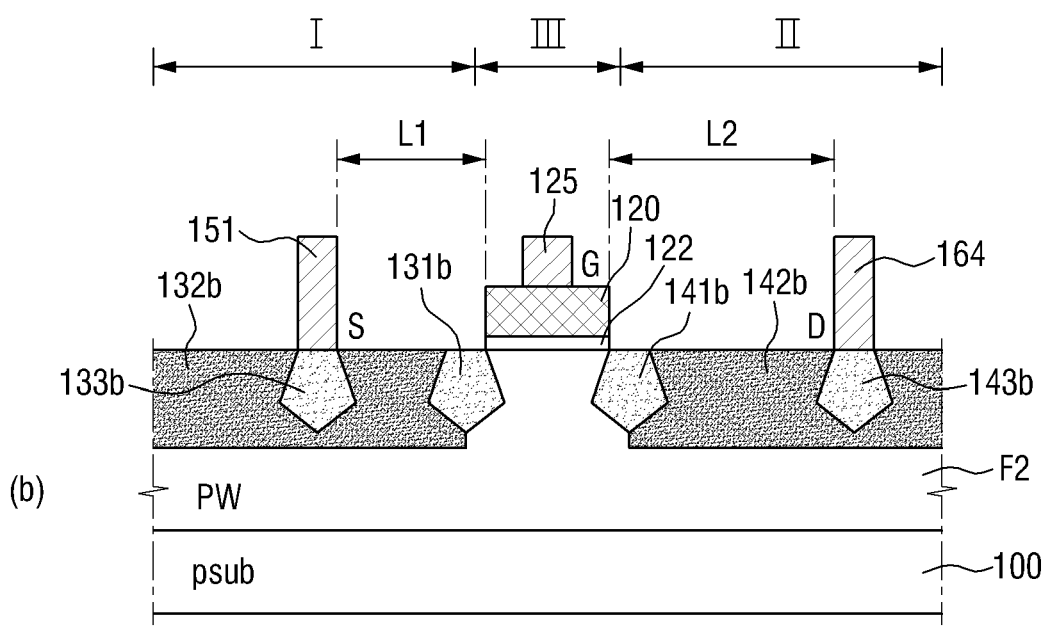

FIG. 19 is a layout view illustrating an ESD protection circuit according to an embodiment of the present inventive concept and FIG. 20 is a cross-sectional view taken along lines A-A and B-B of FIG. 19. Referring to FIGS. 19 and 20, a GCNMOS 22 according to an embodiment of the present inventive concept may include a transistor TR2, a capacitor C and a resistor R.

The transistor TR2 of the GCNMOS 22 may be substantially the same with the GGNMOS 12 shown in FIGS. 8 to 10. For example, sectional shapes taken along the lines A-A and B-B of FIG. 20 may be substantially the same with the sectional shape of FIG. 9. In the plurality of fins F1 to F4, both of the source contact plugs 151 to 154 may be disposed to be closer to the gate electrode 120 and distances between the gate electrode 120 and the source contact plugs 151 to 154 are the same as each other. Accordingly, the respective transistors formed in the plurality of fins F1 to 4 may have the same characteristics and detailed descriptions thereof are the same with those of the previous embodiments and will not be given.

Figure 21:
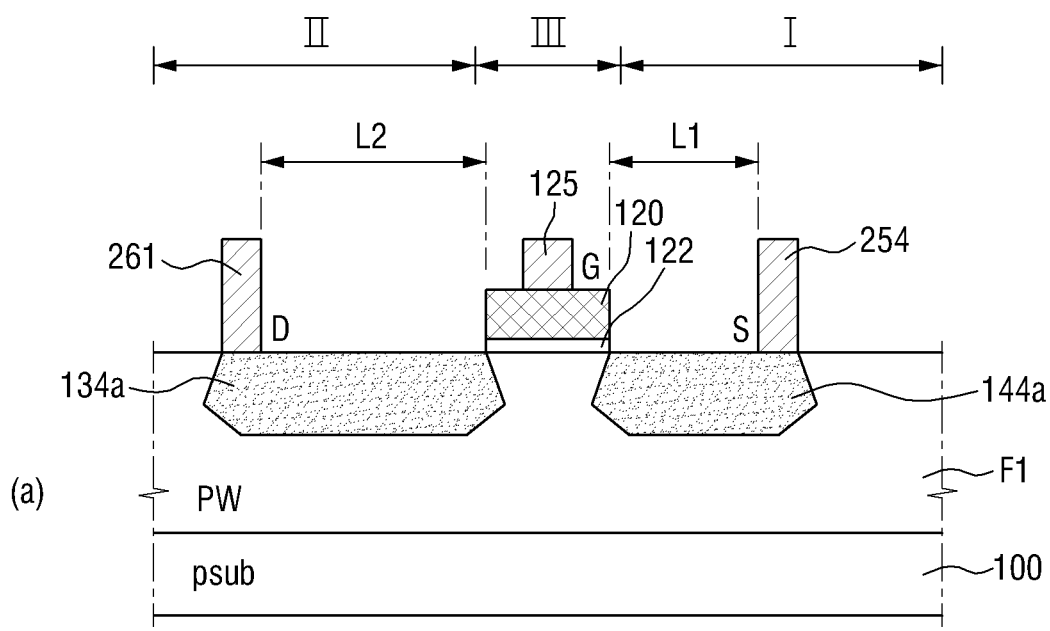
FIG. 21 is a cross-sectional view illustrating an ESD protection circuit according to another embodiment of the present inventive concept.
Figure 21:
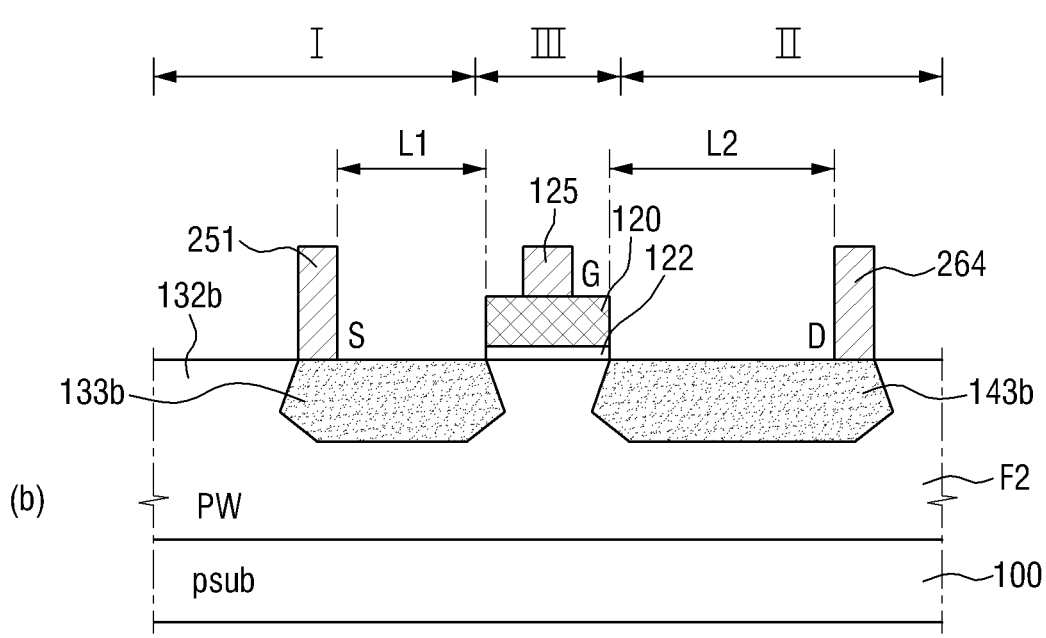

FIG. 21 is a cross-sectional view taken along the lines A-A and B-B of FIG. 19 according to another embodiment of the present inventive concept. Referring to FIGS. 19 and 21, a GCNMOS 23 according to an embodiment of the inventive concept may include a transistor TR2, a capacitor C, and a resistor R.

The transistor TR2 of the GCNMOS 23 may be substantially the same as that of the GGNMOS 11 shown in FIG. 11.

The capacitor C and the resistor R of the GCNMOS 23 may be substantially the same as those included in the GGNMOS 20 shown in FIGS. 14 to 17 and detailed descriptions thereof are the same with those of the previous embodiments and will not be given. However, embodiments of the present inventive concept are not limited thereto.

Figure 22:
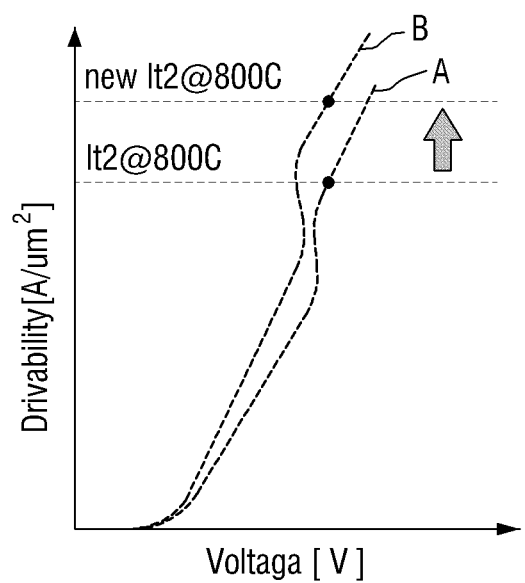
FIG. 22 is a graph for explaining operations of ESD protection circuits according to embodiments of the present inventive concept.

FIG. 22 is a graph for explaining operations of ESD protection circuits according to some embodiments of the present inventive concept.

Referring to FIG. 22, functional components of the ESD protection circuit may be formed by changing mask patterns of a semiconductor device. In the ESD protection circuits according to some embodiments of the present inventive concept, as a source region I and a drain region II are alternately disposed at one side of the gate electrode 120, the source region I of a first fin F1 and the drain region II of a second fin F2, which are adjacent to each other, may function as parasitic NPN transistors. That is to say, additional current paths are formed between the source region I and the drain region II adjacent to each other, thereby performing an ESD function for preventing a surge from being applied to source contact plugs 151 to 154 and 251 to 254 or drain contact plugs 161 to 164 and 261 to 264. The additional current paths may be formed at opposite sides of each fin to perform an ESD function for preventing a higher level of surge. Accordingly, compared to the conventional case in which the source region I and the drain region II are divided with respect to the gate electrode 120, an improved ESD function can be performed according to some embodiments of the present inventive concept.

The ESD protection circuits according to the various embodiments described herein may cover a higher level of surge than the conventional ESD protection circuit, thereby preventing the semiconductor device from experiencing ESD deterioration. Although not shown, an area occupied by the ESD protection circuit can be reduced, thereby saving the manufacturing cost.

Next, semiconductor devices according to embodiments of the present inventive concept will be described with reference to FIGS. 23 and 24.

Figure 23:
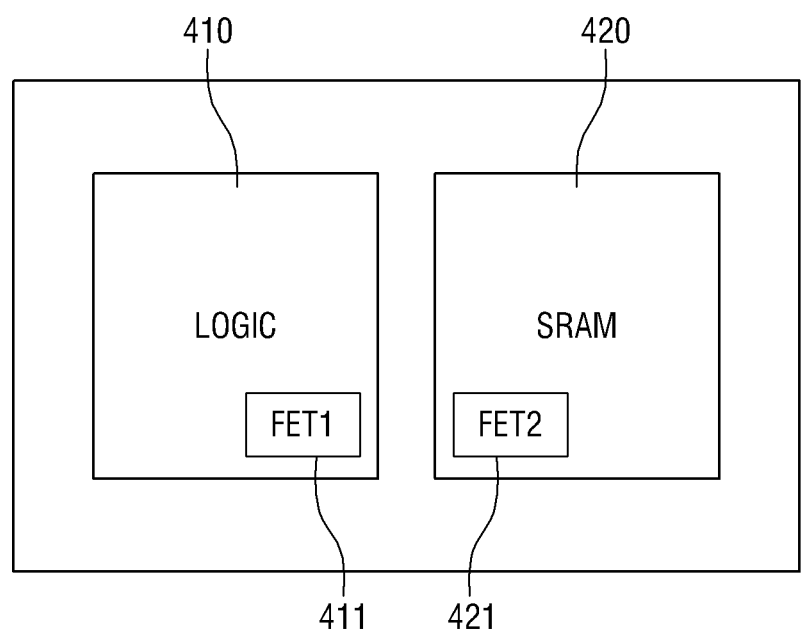
FIG. 23 is a view for explaining a semiconductor device according to an embodiment of the present inventive concept.
Figure 24:
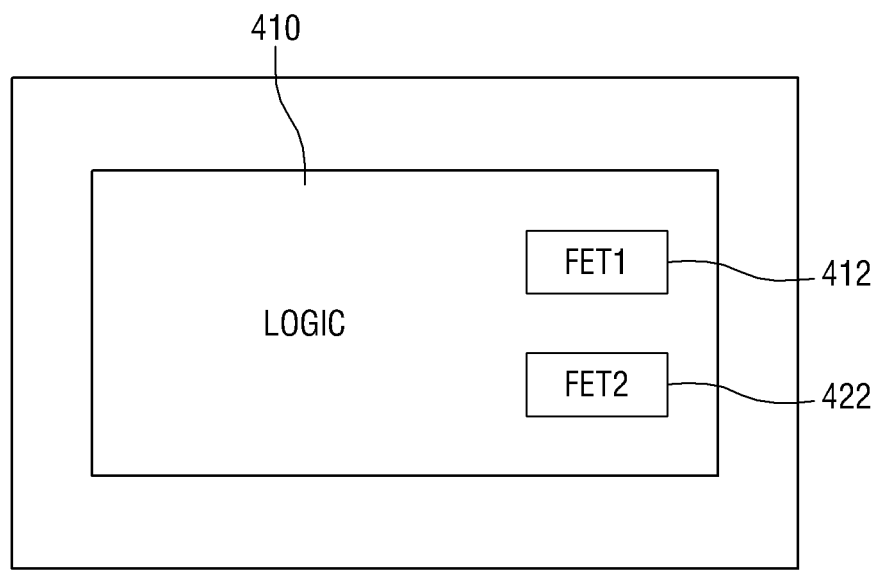
FIG. 24 is a view for explaining a semiconductor device according to an embodiment of the present inventive concept.

FIG. 23 is a view for explaining a semiconductor device according to an embodiment of the present inventive concept and FIG. 24 is a view for explaining a semiconductor device according to an embodiment of the present inventive concept.

First, referring to FIG. 23, the semiconductor device 24 according to one embodiment of the present inventive concept may include a logic region 410 and an SRAM forming region 420. A first transistor 411 may be disposed in the logic region 410 and a second transistor 421 may be disposed in the SRAM region 420.

Next, referring to FIG. 24, the semiconductor device 25 according to one embodiment of the present inventive concept may include a logic region 410. Third and fourth transistors 412 and 422 different from each other may be disposed in the logic region 410. In one embodiment, the third and fourth transistors 412 and 422 different from each other may also be disposed in an SRAM forming region.

Here, the first transistor 411 may be one of the semiconductor devices 10 to 15 and 20 to 25 according to embodiments of the present inventive concept, and the second transistor 421 may be the other of the semiconductor devices 10 to 15 and 20 to 25 according to the embodiments of the present inventive concept. For example, the first transistor 411 may be the semiconductor device 10 shown in FIG. 2 and the second transistor 421 may be the semiconductor device 20 shown in FIG. 14.

The third transistor 412 may also be one of the semiconductor devices 10 to 15 and 20 to 25 according to the embodiments of the present inventive concept, and the fourth transistor 422 may also be the other of the semiconductor devices 10 to 15 and 20 to 25 according to the embodiments of the present inventive concept.

In FIG. 23, the logic region 410 and the SRAM forming region 420 are exemplified, but aspects of the present inventive concept are not limited thereto. For example, the present embodiments may also be applied to the logic region 410 and other memory regions (e.g., DRAM, MRAM, RRAM, PRAM, etc.).

Figure 25:
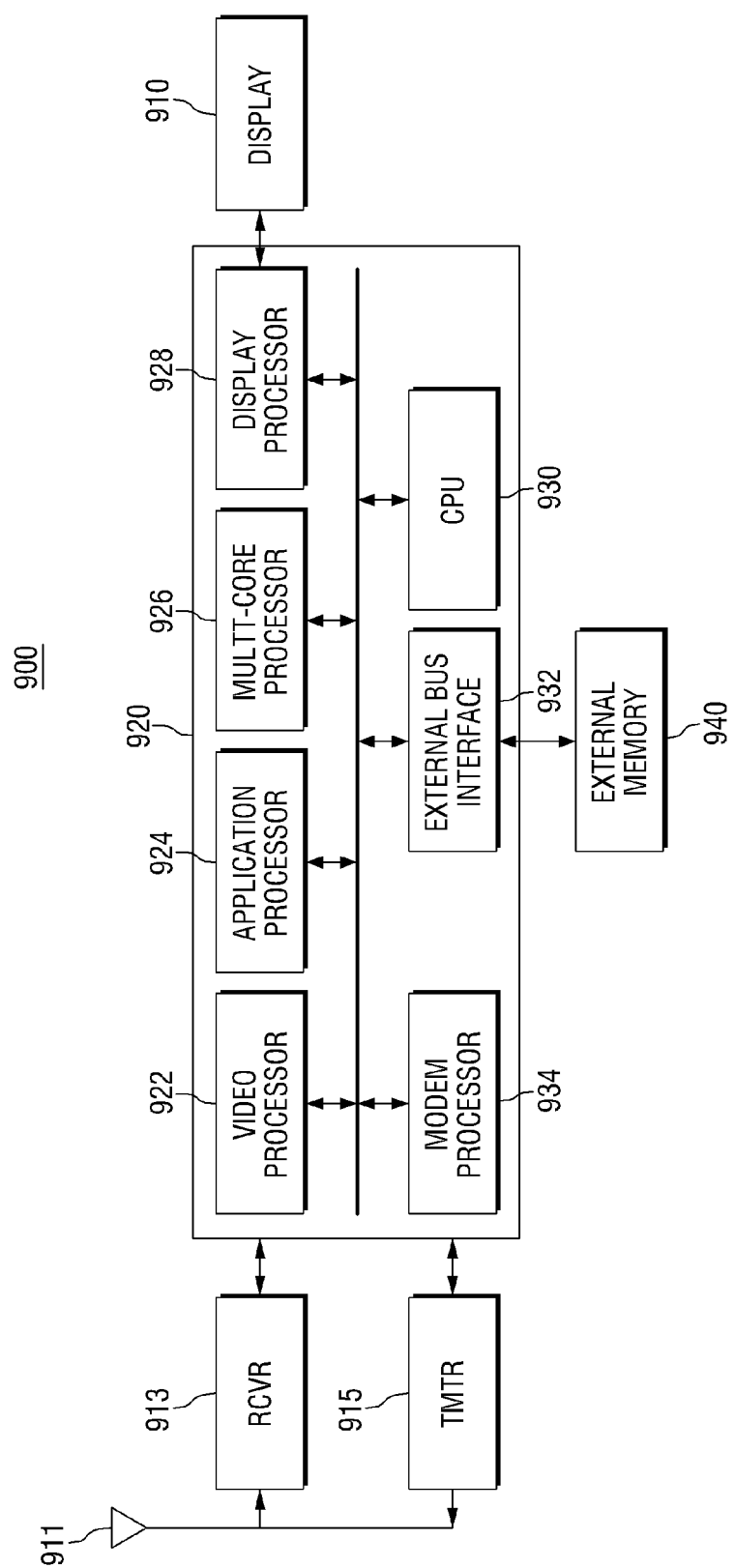
FIG. 25 is a block diagram of a wireless communication device including semiconductor devices according to embodiments of the present inventive concept.

FIG. 25 is a block diagram of a wireless communication device including semiconductor devices according to embodiments of the present inventive concept.

Referring to FIG. 25, a device 900 may be an electronic device such as a cellular phone, a smart phone terminal, a handset, a personal digital assistant (PDA), a laptop computer, a video game unit or other devices. The device 900 may adopt code division multiple access (CDMA), time division multiple access (TDMA) such as a global system for mobile communications (GSM), or other types of wireless communication standards.

The device 900 may provide bi-directional communication through a reception path and a transmission path. On the reception path, signals transmitted by one or more base stations may be received by an antenna 911 or may be provided to a receiver (RCVR) 913. The receiver 913 may condition and digitalize the received signals and may provide samples to a digital section 920 for further processing. On the transmission path, a transmitter (TMTR) 915) may receive the data transmitted from the digital section 920, may process and condition the data and may generate modulated signals to be transmitted to one or more base stations through the antenna 911.

The digital section 920 may be implemented by one or more digital signal processors (DSPs), a micro-processor, or a reduced instruction set computer (RISC). The digital section 920 may be fabricated on one or more application specific integrated circuits (ASICs) or other types of ICs.

The digital section 920 may include, for example, various processing and interface units, such as a modem processor 934, a video processor 922, an application processor 924, a display processor 928, a controller/multi-core processor 926, a central processing unit 930, and an external bus interface (EBI) 932.

The video processor 922 may perform processing on graphic applications. In general, the video processor 922 may include an arbitrary number of processing units or modules for an arbitrary set of graphic operations. Particular parts of the video processor 922 may be implemented by firmware and/or software. For example, a control unit may be implemented by firmware and/or software modules for performing the above-described functions (e.g., procedures, functions, etc.). Firmware and/or software codes may be stored in a memory or may be executed by a processor (e.g., the multi-core processor 926). The memory may be implemented inside or outside the processor.

The video processor 922 may implement software interface such as open graphic library (OpenGL) or Direct3D. The central processing unit 930 may perform a series of graphic processing operations with the video processor 922. The controller/multi-core processor 926, including at least two cores, may allocate workloads to the at least two cores according to the workload to be processed by the controller/multi-core processor 926 and may simultaneously process the corresponding workloads.

In the illustrated embodiment, the application processor 924 is exemplified as a component of the digital section 920, but aspects of the present inventive concept are not limited thereto. In some embodiments of the present inventive concept, the digital section 920 may be incorporated into one application processor 924 or an application chip.

The modem processor 934 may perform operations required during data transmission between the receiver 913, the transmitter 915 and the digital section 920. The display processor 928 may perform operations required to drive the display 910.

The semiconductor devices 1 to 14 according to the above-described embodiments of the present inventive concept may be used as cache memories or buffer memories used in performing operations of the processors 922, 924, 926, 928, 930 and 934.

Next, a computing system including a semiconductor device according to embodiments of the present inventive concept will be described with reference to FIG. 26.

Figure 26:
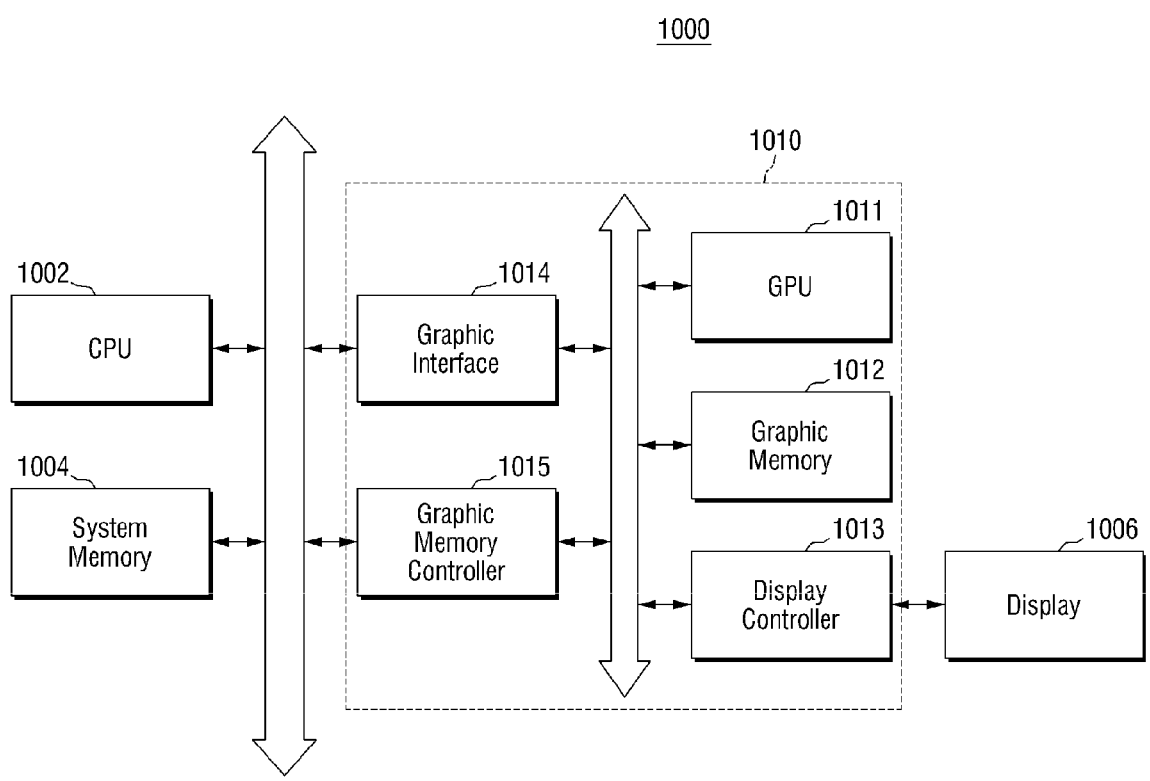
FIG. 26 is a block diagram of a computing system including semiconductor devices according to embodiments of the present inventive concept.

FIG. 26 is a block diagram of a computing system including a semiconductor device according to embodiments of the present inventive concept.

Referring to FIG. 26, the computing system 1000 may include a central processing unit (CPU) 1002, a system memory 1004, a graphic system 1010, and a display 1006.

The CPU 1002 may perform operations required to drive the computing system 1000. The system memory 1004 may be configured to store data. The system memory 1004 may store data processed by the CPU 1002. The system memory 1004 may function as a working memory of the CPU 1002. The system memory 1004 may include one or more volatile memory devices, such as a double data rate static dynamic random access memory (DDR SDRAM), or a single data rate static dynamic random access memory (SDR SDRAM), and/or one or more nonvolatile memory devices, such as an electrical erasable programmable ROM (EEPROM) or a flash memory. One of the semiconductor devices 10 to 15 and 20 to 25 according to the above-described embodiments of the present inventive concept may be employed as a component of the system memory 1004.

The graphic memory 1010 may include a graphic processing unit (GPU) 1011, a graphic memory 1012, a display controller 1013, a graphic interface 1014, and a graphic memory controller 1015.

The GPU 1011 may perform graphic operations required for the computing system 1000. In detail, the GPU 1011 may assemble primitives including one or more vertexes and may perform rendering using the assembled primitives.

The graphic memory 1012 may store graphic data processed by the GPU 1011 or may store data provided to the GPU 1011. Alternatively, the graphic memory 1012 may function as a working memory of the GPU 1011. One of the semiconductor devices 10 to 15 and 20 to 25 according to the above-described embodiments of the present inventive concept may be employed as a component of the graphic memory 1012.

The display controller 1013 may control the display 1006 to display a rendered image frame.

The graphic interface 1014 may interface between the CPU 1002 and the GPU 1011, and the graphic memory controller 1015 may provide memory access between the system memory 1004 and the GPU 1011.

Although not shown in FIG. 26, the computing system 1000 may include at least one input device, such as buttons, a touch screen, a microphone, and so on, and/or at least one output device, such as a speaker and so on. The computing system 1000 may further include an interface device for exchanging data with an external device in a wired or wireless manner. The interface device may include an antenna or a wired/wireless transceiver, and so on.

According to embodiments, the computing system 1000 may be an electronic device, such as a mobile phone, a smart phone, a personal digital assistant (PDA), a desktop computer, a notebook computer, a tablet PC, or the like.

Next, an exemplary electronic system including a semiconductor device according to some embodiments of the present inventive concept will be described with reference to FIG. 27.

Figure 27:
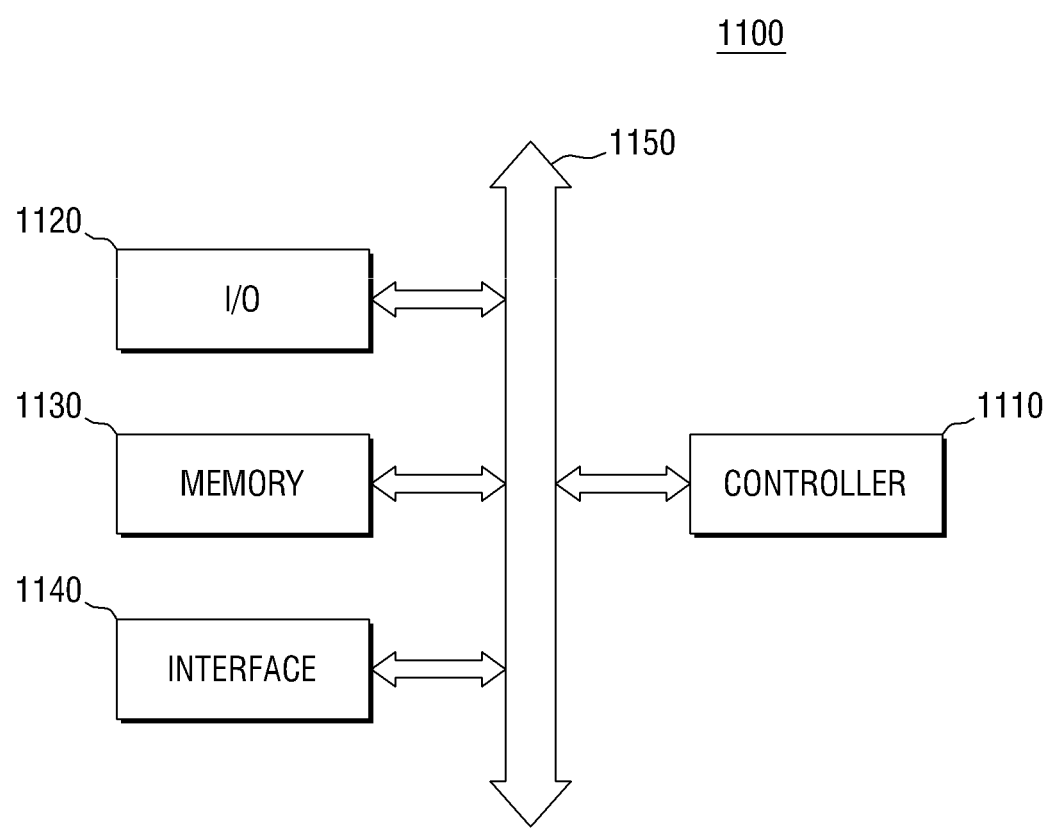
FIG. 27 is a block diagram of an electronic system including a semiconductor device according to embodiments of the present inventive concept.

FIG. 27 is a block diagram of an electronic system including a semiconductor device according to some embodiments of the present inventive concept.

Referring to FIG. 27, the electronic system 1100 according to some embodiments of the present inventive concept may include a controller 1110, an input/output device (I/O) 1120, a memory device 1130, an interface 1140 and a bus 1150. The controller 1110, the I/O 1120, the memory device 1130, and/or the interface 1140 may be connected to one another through the bus 1150. The bus 1150 may correspond to a path through which data moves.

The controller 1110 may include at least one of a microprocessor, a digital signal processor, a microcontroller, and logic elements capable of functions similar to those of these elements. The I/O 1120 may include a keypad, a keyboard and a display. The memory device 1130 may store data and/or commands. The interface 1140 may perform functions of transmitting data to a communication network or receiving data from a communication network. The interface 1140 may be wired or wireless. For example, the interface 1140 may include an antenna or a wired/wireless transceiver, and so on.

Although not shown, the electronic system 1100 is a working memory for improving the operation of the controller 1110 and may further include a high-speed DRAM and/or SRAM. Here, one of the semiconductor devices 10 to 15 and 20 to 25 according to some embodiments of the present inventive concept may be employed as the working memory. The semiconductor devices 10 to 15 and 20 to 25 according to some embodiments of the present inventive concept may be provided in the memory device 1130 or may be provided as some components of the controller 1110, the I/O 1120, or the like.

The electronic system 1100 may be applied to a wireless communication device, such as a personal digital assistant (PDA), a portable computer, a web tablet, a wireless phone, a mobile phone, a digital music player, a memory card, or any type of electronic device capable of transmitting and/or receiving information in a wireless environment.

Figure 28:
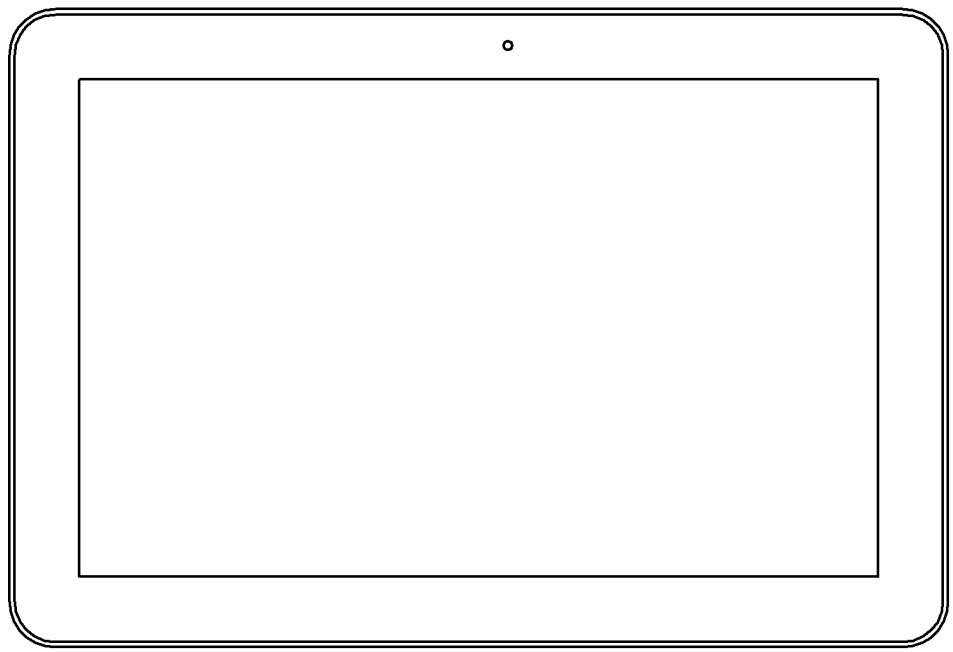
FIGS. 28 to 30 illustrate exemplary semiconductor systems to which semiconductor devices according to embodiments of the present inventive concept can be employed.
Figure 29:
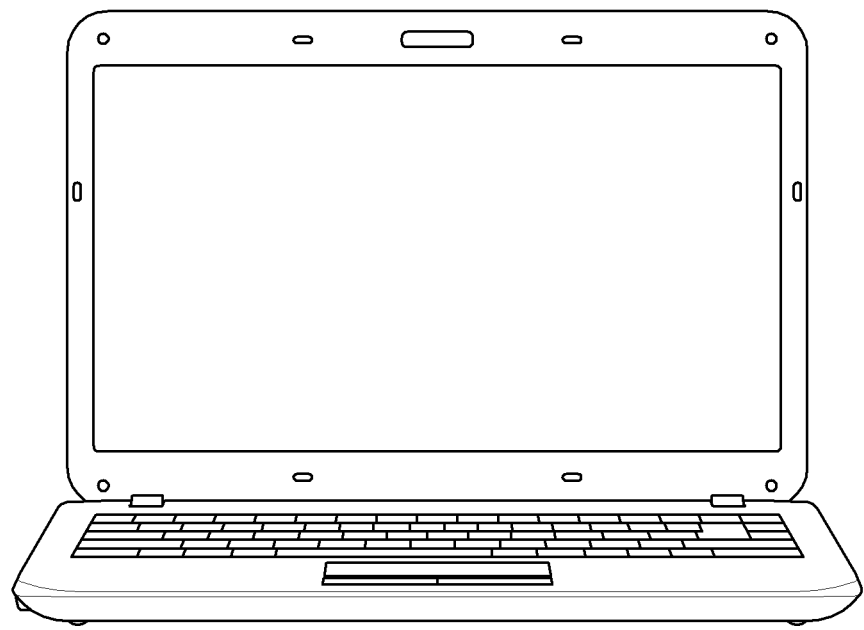
Figure 30:
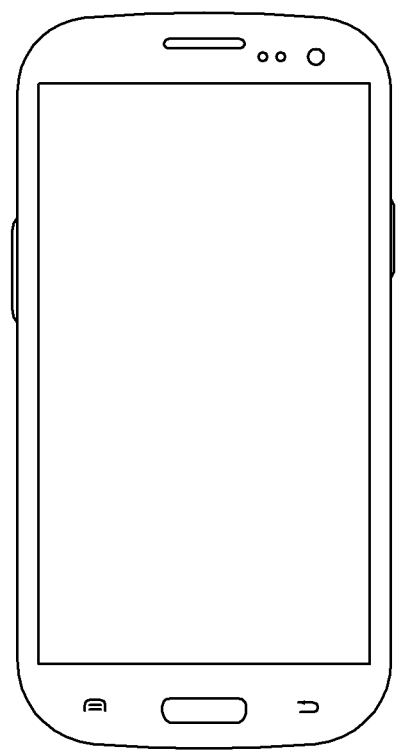

FIGS. 28 to 30 illustrate exemplary semiconductor systems to which semiconductor devices according to some embodiments of the present inventive concept can be employed.

Specifically, FIG. 28 illustrates an example in which a semiconductor device according to an embodiment of the present inventive concept is applied to n electronic device such as a tablet PC (1200), FIG. 29 illustrates an example in which a semiconductor device according to an embodiment of the present inventive concept is applied to an electronic device such as a notebook computer (1300) and FIG. 30 illustrates an example in which a semiconductor device according to an embodiment of the present inventive concept is applied to an electronic device such as a smart phone (1400). At least one of the semiconductor devices 10 to 15 and 20 to 25 according to some embodiments of the present inventive concept may be applied to the tablet PC 1200, the notebook computer 1300 and the smart phone 1400.

In addition, the semiconductor devices according to some embodiments of the present inventive concept may also be applied to other IC devices not illustrated herein.

In the above-described embodiments, as the at least one of the semiconductor devices, semiconductor systems, and methods for controlling the semiconductor devices according to some embodiments of the present inventive concept, the tablet PC 1200, the notebook computer 1300 and smart phone 1400 are exemplified, but aspects of the present inventive concept are not limited thereto. In some embodiments of the present inventive concept, the semiconductor systems can be implemented as computers, ultra mobile personal computers (UMPCs), work stations, net-books, personal digital assistants (PDAs), portable computers, web tablets, wireless phones, mobile phones, smart phones, e-books, portable multimedia players (PMPs), portable game consoles, navigation devices, black boxes, digital cameras, 3-dimensional televisions, digital audio recorders, digital audio players, digital video recorders, digital video players, and so on.

While various aspects of the present inventive concept have been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device including an electrostatic discharge (ESD) protection circuit, the semiconductor device comprising:

an input port;

a logic circuit receiving an input signal applied to the input port and generating an output signal based on the input signal; and
an ESD protection circuit adjusting a level of the input signal when the level of the input signal exceeds a predetermined range,
wherein the ESD protection circuit comprises: a first fin and a second fin arranged on a semiconductor substrate in parallel, and a gate electrode formed in a direction crossing the first fin and the second fin, each of the first fin and the second fin includes a source region, a drain region, and a channel region disposed between the source region and the drain region, the channel region is disposed under the gate electrode, a source region of the first fin and a drain region of the second fin are disposed at a first side of the gate electrode, and a drain region of the first fin and a source region of the second fin are disposed at a second side of the gate electrode.

2. The semiconductor device of claim 1, wherein the source region includes a first epitaxial layer disposed at the first side of the gate electrode, a second epitaxial layer disposed to be spaced apart from the first epitaxial layer and a first doping layer disposed between the first epitaxial layer and the second epitaxial layer, and the drain region includes a third epitaxial layer disposed at the second side of the gate electrode, a fourth epitaxial layer disposed to be spaced apart from the third epitaxial layer and a second doping layer disposed between the third epitaxial layer and the fourth epitaxial layer.

3. The semiconductor device of claim 2, wherein the first epitaxial layer and the third epitaxial layer are formed to contact opposite sides of the channel region.

4. The semiconductor device of claim 2, further comprising:
a source contact plug formed on the second epitaxial layer; and
a drain contact plug formed on the fourth epitaxial layer.

5. The semiconductor device of claim 4, wherein the source contact plug formed on a source region of the first fin and the drain contact plug formed on a drain region of the second fin are disposed on a first line parallel with a direction in which the gate electrode extends.

6. The semiconductor device of claim 4, wherein the source contact plug formed on a source region of the first fin is disposed on a first line parallel with a direction in which the gate electrode extends, the drain contact plug formed on a drain region of the second fin is disposed on a first line parallel with a second line parallel with the first line and different from the first line, and the first line and the second line are disposed at the first side of the gate electrode.

7. The semiconductor device of claim 2, wherein the first and second doping layers are doped in a second conductivity type.

8. The semiconductor device of claim 2, wherein the first to fourth epitaxial layers include at least one of silicon germanium (SiGe) or silicon carbide (SiC).

9. The semiconductor device of claim 1, wherein the source region includes a first epitaxial layer disposed in a first recess formed at the first side of the gate electrode, the drain region includes a second epitaxial layer disposed in a second recess formed at the second side of the gate electrode, and lengths of the first and second epitaxial layers, measured in a direction in which the first fin extends, are greater than a length of the channel region.

10. The semiconductor device of claim 9, further comprising:

a source contact plug formed on the first epitaxial layer; and
a drain contact plug formed on the second epitaxial layer,
wherein the source contact plug is disposed to be closer to the gate electrode than the drain contact plug.

11. The semiconductor device of claim 1, wherein the gate electrode and the source region are electrically connected.

12. The semiconductor device of claim 1, wherein the ESD protection circuit further comprises:
a resistor connected between the source region and the gate electrode; and
a capacitor connected between the drain region and the gate electrode.

13. The semiconductor device of claim 12, wherein the resistor is formed in a P type well of the semiconductor substrate and the capacitor is formed in an N type well of the semiconductor substrate.

14. The semiconductor device of claim 1, further comprising an isolation layer formed between the first fin and the second fin, wherein a bottom surface of the isolation layer is formed to be lower than a bottom surface of the source region or the drain region.

15. A semiconductor device comprising:
a first fin and a second fin disposed on a semiconductor substrate to be parallel with each other;
a gate electrode formed in a direction crossing the first and the second fin;
a source region of the first fin and a drain region of the second fin disposed at one side of the gate electrode;
a drain region of the first fin and a source region of the second fin disposed at the other side of the gate electrode;
first and second wires disposed at a first side of the gate electrode and formed to be parallel with the gate electrode; and
third and fourth wires disposed at a second side of the gate electrode and formed to be parallel with the gate electrode,
wherein the first wire is electrically connected to the drain region of the first fin, the second wire is electrically connected to the source region of the second fin, the third wire is electrically connected to the source region of the first fin and the second wire, and the fourth wire is electrically connected to the drain region of the second fin and the first wire.

16. The semiconductor device of claim 15, further comprising:
a first drain contact plug positioned between the first wire and the drain region of the first fin;
a first source contact plug positioned between the second wire and the source region of the second fin;
a second source contact plug positioned between the third wire and the source region of the first fin; and
a second drain contact plug positioned between the fourth wire and the drain region of the second fin,
wherein the first source contact plug and the first drain contact plug are disposed at the first side of the gate electrode, and the second source contact plug and the second drain contact plug are disposed at the second side of the gate electrode.

17. The semiconductor device of claim 16, wherein the first source contact plug and the first drain contact plug are disposed on a first line parallel with a direction in which the gate electrode extends, and
wherein the first source contact plug is disposed on the first line parallel with a direction in which the gate electrode extends, the first drain contact plug is disposed on a second line parallel with the first line and different from the first line, and the first line and the second line are disposed at the first side of the gate electrode.

18. A semiconductor device comprising:
an input port;
a logic circuit receiving an input signal applied to the input port and generating an output signal based on the received input signal; and
an electrostatic discharge (ESD) protection circuit adjusting a level of the input signal when the level of the input signal is out of a predetermined range,
wherein the ESD protection circuit includes first and second transistors each including a source, a drain, and a gate interposed between the source and the drain, a first parasitic transistor formed between the source of the first transistor and the drain of the second transistor, and a second parasitic transistor formed between the drain of the first transistor and the source of the second transistor.

19. The semiconductor device of claim 18, wherein the gate of the first transistor is electrically connected to the source of the first transistor, and the gate of the second transistor is electrically connected to the source of the second transistor.

20. The semiconductor device of claim 18, wherein the source of the first transistor is adjacent to the drain of the second transistor, and
wherein the drain of the first transistor is adjacent to the source of the second transistor.

\* \* \* \* \*